United States Patent
Kim

(10) Patent No.: US 9,892,792 B2
(45) Date of Patent: *Feb. 13, 2018

(54) OPERATING METHOD OF A NONVOLATILE MEMORY DEVICE

(71) Applicant: SAMSUNG ELECTRONICS CO., LTD., Suwon-si, Gyeonggi-Do (KR)

(72) Inventor: Wandong Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/460,660

(22) Filed: Mar. 16, 2017

(65) Prior Publication Data

US 2017/0186489 A1    Jun. 29, 2017

Related U.S. Application Data

(63) Continuation of application No. 14/997,730, filed on Jan. 18, 2016, now Pat. No. 9,620,219.

(30) Foreign Application Priority Data

Jan. 21, 2015  (KR) ......................... 10-2015-0009951

(51) Int. Cl.
  *G11C 16/10*    (2006.01)
  *G11C 16/34*    (2006.01)
  *G11C 16/04*    (2006.01)

(52) U.S. Cl.
  CPC .......... *G11C 16/10* (2013.01); *G11C 16/0483* (2013.01); *G11C 16/3459* (2013.01)

(58) Field of Classification Search
  CPC ................................. G11C 16/10; G11C 16/26

USPC ........................................ 365/185.17, 185.24
See application file for complete search history.

(56) References Cited

U.S. PATENT DOCUMENTS

| | | | |
|---|---|---|---|
| 7,403,429 B2 | 7/2008 | Chae et al. | |
| 7,468,907 B2* | 12/2008 | Kang | G11C 11/5628 365/185.03 |
| 7,499,335 B2 | 3/2009 | Ho et al. | |
| 7,548,458 B2 | 6/2009 | Wu | |
| 7,679,133 B2 | 3/2010 | Son et al. | |
| 7,881,112 B2 | 2/2011 | Hsu et al. | |
| 8,077,524 B2 | 12/2011 | Lutze et al. | |

(Continued)

OTHER PUBLICATIONS

Choe, Byeong-In, et al., "Suppression of Inhibit Cell Vth Distrubance in Three Dimensional Stack Nand Flash Memory", Journal of Nanoscience and Nanotechnology, vol. 13, 2013, pp. 6382-6388.

*Primary Examiner* — Michael Tran
(74) *Attorney, Agent, or Firm* — F. Chau & Associates, LLC

(57) ABSTRACT

A method of operating a nonvolatile memory device includes: first programming a target transistor of a cell string of the nonvolatile memory device, wherein the target transistor has a first threshold voltage distribution after the first programming, and wherein the cell string includes a plurality of transistors; and second programming the target transistor of the cell string, wherein the first transistor has a second threshold voltage distribution after the second programming, wherein a width of the second threshold voltage distribution is less than a width of the first threshold voltage distribution.

26 Claims, 22 Drawing Sheets

(56) References Cited

U.S. PATENT DOCUMENTS

| | | | |
|---|---|---|---|
| 8,421,397 B2 * | 4/2013 | Yu | H02P 1/28 318/778 |
| 8,446,776 B2 * | 5/2013 | Hwang | G11C 11/5628 365/185.18 |
| 8,503,213 B2 | 8/2013 | Chen et al. | |
| 8,553,466 B2 | 10/2013 | Han et al. | |
| 8,559,235 B2 | 10/2013 | Yoon et al. | |
| 8,582,369 B2 * | 11/2013 | Nagadomi | G11C 16/0483 365/185.03 |
| 8,649,219 B2 | 2/2014 | Li et al. | |
| 8,654,587 B2 | 2/2014 | Yoon et al. | |
| 8,665,652 B2 | 3/2014 | Huang et al. | |
| 8,773,903 B2 | 7/2014 | Lee et al. | |
| 8,853,818 B2 | 10/2014 | Lue | |
| 8,867,280 B2 | 10/2014 | Park et al. | |
| 8,929,142 B2 | 1/2015 | Dong et al. | |
| 8,964,473 B2 * | 2/2015 | Dong | H01L 27/11519 365/185.05 |
| 8,964,481 B2 | 2/2015 | Oh et al. | |
| 8,976,597 B2 * | 3/2015 | Shiino | G11C 16/16 365/185.19 |
| 9,064,598 B1 * | 6/2015 | Hirai | G11C 16/3445 |
| 9,087,590 B2 * | 7/2015 | Park, II | G11C 16/0483 |
| 9,142,298 B2 | 9/2015 | Dong et al. | |
| 9,230,665 B2 * | 1/2016 | Hosono | G11C 11/5628 |
| 9,251,902 B2 * | 2/2016 | Harada | G11C 16/10 |
| 9,367,391 B2 * | 6/2016 | Lam | G06F 11/1048 |
| 9,484,097 B2 * | 11/2016 | Kim | G11C 11/5628 |
| 9,685,233 B2 * | 6/2017 | Hsieh | G11C 16/10 |
| 2011/0233648 A1 | 9/2011 | Seol et al. | |
| 2013/0223142 A1 | 8/2013 | Park et al. | |
| 2013/0250688 A1 | 9/2013 | Chen et al. | |
| 2013/0250689 A1 | 9/2013 | Lai et al. | |
| 2013/0250690 A1 | 9/2013 | Lai et al. | |
| 2014/0119120 A1 | 5/2014 | Lee | |
| 2014/0192594 A1 | 7/2014 | Lue | |
| 2014/0219027 A1 | 8/2014 | Dong et al. | |
| 2014/0233315 A1 | 8/2014 | Park et al. | |
| 2016/0064083 A1 | 3/2016 | Nam et al. | |
| 2016/0211027 A1 | 7/2016 | Kim | |

* cited by examiner

FIG. 2
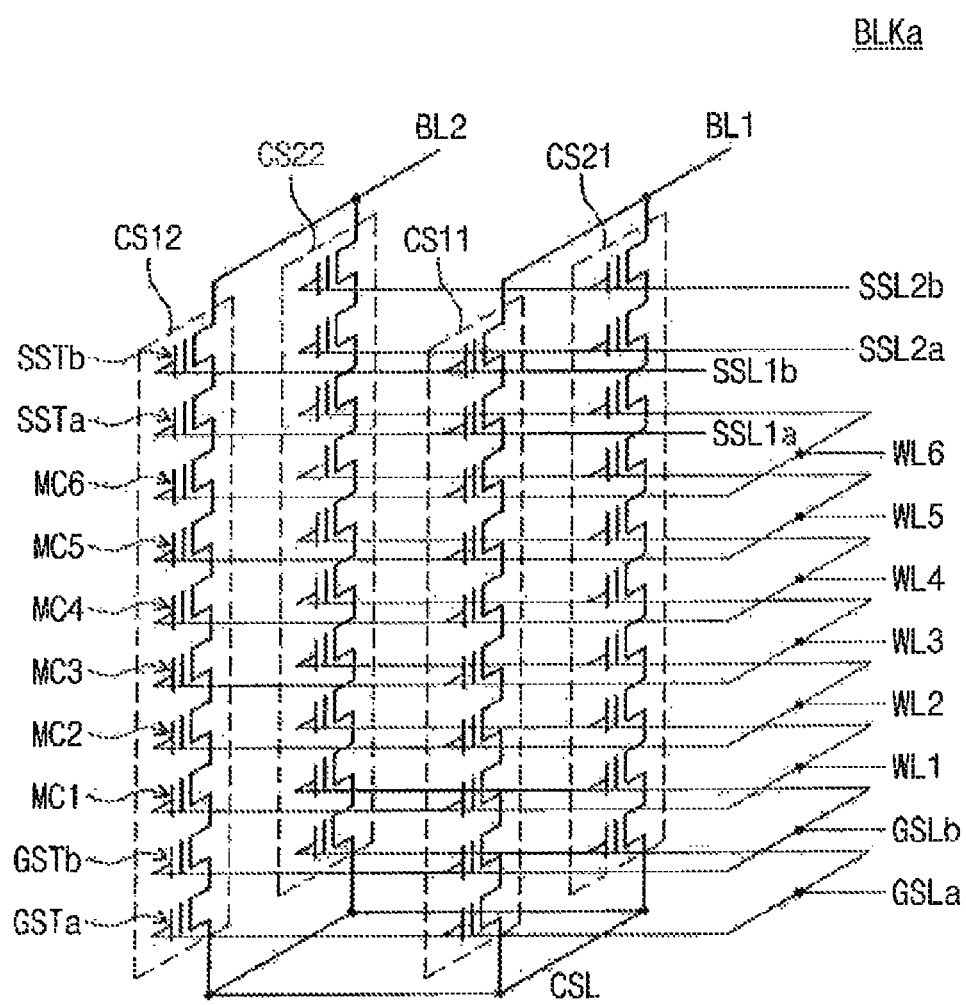
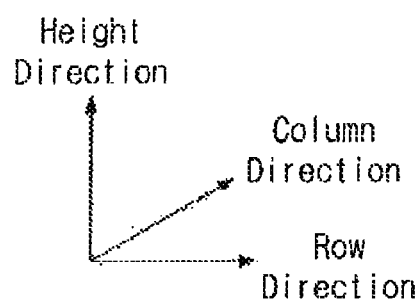

| BL | VBL1(Low) |
| --- | --- |
| SSL | VSSL1(High) |
| Unselected WL | VPASS1 |
| Selected WL | VPGM1 |
| GSL | VGSL1(High) |
| CSL | VCSL1(Low) |

FIG. 7

| BL | VBL2(Low) |
|---|---|
| SSL | VSSL2(High) |
| WL | VPASS2 |
| Unselected GSL | VGSL2(High) |
| Selected GSL | VPGM2 |
| CSL | VCSL2(Low) |

FIG. 9

| | |
|---|---|
| Unselected BL | VBL4(Low) |
| Selected BL | VBL3(High) |
| Unselected SSL | VSSL4(High) |
| Selected SSL | VSSL3(High) |
| Unselected WL | VPASS3 |
| Selected WL | VPGM3(Negative) |
| GSL | VGSL3(High) |
| CSL | VCSL3(Low) |

FIG. 14

| | |
|---|---|
| Unselected BL | VBL6(Low) |
| Selected BL | VBL5(High) |
| Unselected SSL | VSSL6(High) |
| Selected SSL | VSSL5(High) |
| WL | VPASS4 |
| Unselected GSL | VGSL4(High) |
| Selected GSL | VPGM4(Negative) |
| CSL | VCSL4(Low) |

OPERATING METHOD OF A NONVOLATILE MEMORY DEVICE

CROSS-REFERENCE TO RELATED APPLICATIONS

This U.S. non-provisional patent application is a continuation application of U.S. patent application Ser. No. 14/997,730, filed on Jan. 18, 2016, now U.S. Pat. No. 9,620,219, which claims priority under 35 U.S.C. § 119 to Korean Patent Application No. 10-2015-0009951, filed on Jan. 21, 2015, the disclosures of which are incorporated by reference herein in their entireties.

TECHNICAL FIELD

The inventive concept relates to a semiconductor memory, and more particularly, to a nonvolatile memory device and an operating method of the nonvolatile memory device.

DISCUSSION OF RELATED ART

A storage device may store data responsive to a control of a host device such as a computer, a smart phone, a smart pad, etc. A storage device may include a hard disk drive (HDD) which stores data on a magnetic disk, or a semiconductor memory which stores data in a nonvolatile memory. The semiconductor memory may be a solid state drive (SSD) or a memory card.

A nonvolatile memory may include a read only memory (ROM), a programmable ROM (PROM), an electrically programmable ROM (EPROM), an electrically erasable and programmable ROM (EEPROM), a flash memory, a phase-change random access memory (PRAM), a resistive RAM (RRAM), a ferroelectric RAM (FRAM), etc.

SUMMARY

In accordance with an exemplary embodiment of the inventive concept, a method of operating a nonvolatile memory device comprises: first programming a target transistor of a cell string of the nonvolatile memory device, wherein the target transistor has a first threshold voltage distribution after the first programming, and wherein the cell string includes a plurality of transistors; and second programming the target transistor of the cell string, wherein the first transistor has a second threshold voltage distribution after the second programming, wherein a width of the second threshold voltage distribution is less than a width of the first threshold voltage distribution.

An upper limit of the first threshold voltage distribution may be higher than a verify voltage and an upper limit of the second threshold voltage distribution may be lower than the verify voltage.

The second programming may not be performed when an upper limit of the first threshold voltage distribution is lower than a verify voltage.

The target transistor may be a ground select transistor or a memory cell.

The second programming may include: applying a boosted voltage to a drain of the target transistor; applying a common source line voltage to a source of the target transistor; and applying a negative voltage to a gate of the target transistor.

The second programming may be a hot hole injection operation.

The first programming may comprise: supplying a low voltage to a channel of the target transistor; and supplying a high voltage to a gate of the target transistor.

In accordance with an exemplary embodiment of the inventive concept, a method of operating a nonvolatile memory device including a plurality of strings, each string including a plurality of sting selection transistors, a plurality of memory cells, and a plurality of ground selection transistors sequentially stacked in a direction perpendicular to a surface of a substrate on which the cell string is disposed, comprises: programming a ground selection transistor of a selected cell string, wherein the programming comprises: applying a boosted voltage to a drain of the ground selection transistor of the selected string; applying a common source line voltage to a source of the ground selection transistor of the selected string; and applying a negative voltage to a gate of the ground selection transistor of the selected string, wherein a width of threshold voltage distribution of the ground selection transistor of the selected string is decreased.

The boosting voltage may be generated by: initially turning on the string selection transistors of the selected string; supplying a bit line voltage to a bit line connected to the selected string; turning off the string selection transistors of the selected string; and applying a pass voltage to the memory cells of the selected string.

A difference between the boost voltage and the negative voltage may cause a hot hole at the ground selection transistor of the selected string.

The bit line voltage may be a low voltage, the common source line voltage may be a low voltage, the turned off string selection transistors may be applied with a high voltage, and an unselected ground selection transistor may be applied with a high voltage.

The string selection transistors, the memory cells and the ground selection transistors of the selected string may be charge trap flash cells.

The method may further comprise: inhibiting programming of a ground selection transistor of an unselected string while the ground selection transistor of the selected string is programmed.

The program inhibiting may comprise: turning on the string selection transistors of the unselected string; supplying a bit line voltage to a bit line connected to the unselected string, wherein the bit line voltage is a low voltage; and applying a pass voltage to the memory cells of the unselected string.

The string selection transistors, the memory cells and the ground selection transistors of the unselected string may be charge trap flash cells.

In accordance with an exemplary embodiment of the inventive concept, a method of operating a nonvolatile memory device including a plurality of strings, each string including at least one string selection transistor, a plurality of memory cells, and at least one ground selection transistor sequentially stacked in a direction perpendicular to a surface of a substrate on which the strings are disposed, wherein the string selection transistors of at least two strings are connected to a string selection line, the ground selection transistors of the at least two strings are connected to a ground selection line, each memory cell of the at least two strings are connected to a wordline, comprises: applying a common source line voltage to a selected string and an unselected string; applying a negative voltage to the ground selection line connected to the selected string and the unselected string; applying a pass voltage to the wordlines of the unselected string and the selected string; applying a ground voltage to a bit line of the unselected string to turn on the string selection transistor of the unselected string; and turning on, and then, turning off the string selection transistor of the selected string to apply a boost voltage to the ground selection transistor of the selected string.

The common source line voltage may be a ground voltage.

The steps of applying a common source line voltage, applying a negative voltage, applying a pass voltage, applying a ground voltage and turning on and off the string selection transistor may be performed when a threshold voltage distribution of the ground selection transistor of the selected string is greater than a verify voltage.

After performing the steps of applying a common source line voltage, applying a negative voltage, applying a pass voltage, applying a ground voltage and turning on and off the string selection transistor, the threshold voltage distribution of the ground selection transistor of the selected string may be less than the verify voltage.

The at least one string selection transistor, the memory cells and the at least one ground selection transistor of each of the strings may be charge trap flash cells.

BRIEF DESCRIPTION OF THE FIGURES

The above and other features of the inventive concept will become more apparent by describing in detail exemplary embodiments thereof with reference to the accompanying drawings.

FIG. 2 is a circuit diagram illustrating a memory block in accordance with an exemplary embodiment of the inventive concept.

FIG. 7 is a table illustrating voltages supplied to a memory block in the first program operation, according to an exemplary embodiment of the inventive concept.

FIG. 9 is a table illustrating voltages supplied to a memory block in the second program operation, according to an exemplary embodiment of the inventive concept.

FIG. 14 is a table illustrating voltages supplied to a memory block in the second program operation, according to an exemplary embodiment of the inventive concept.

DETAILED DESCRIPTION OF THE EMBODIMENTS

Figure 1:
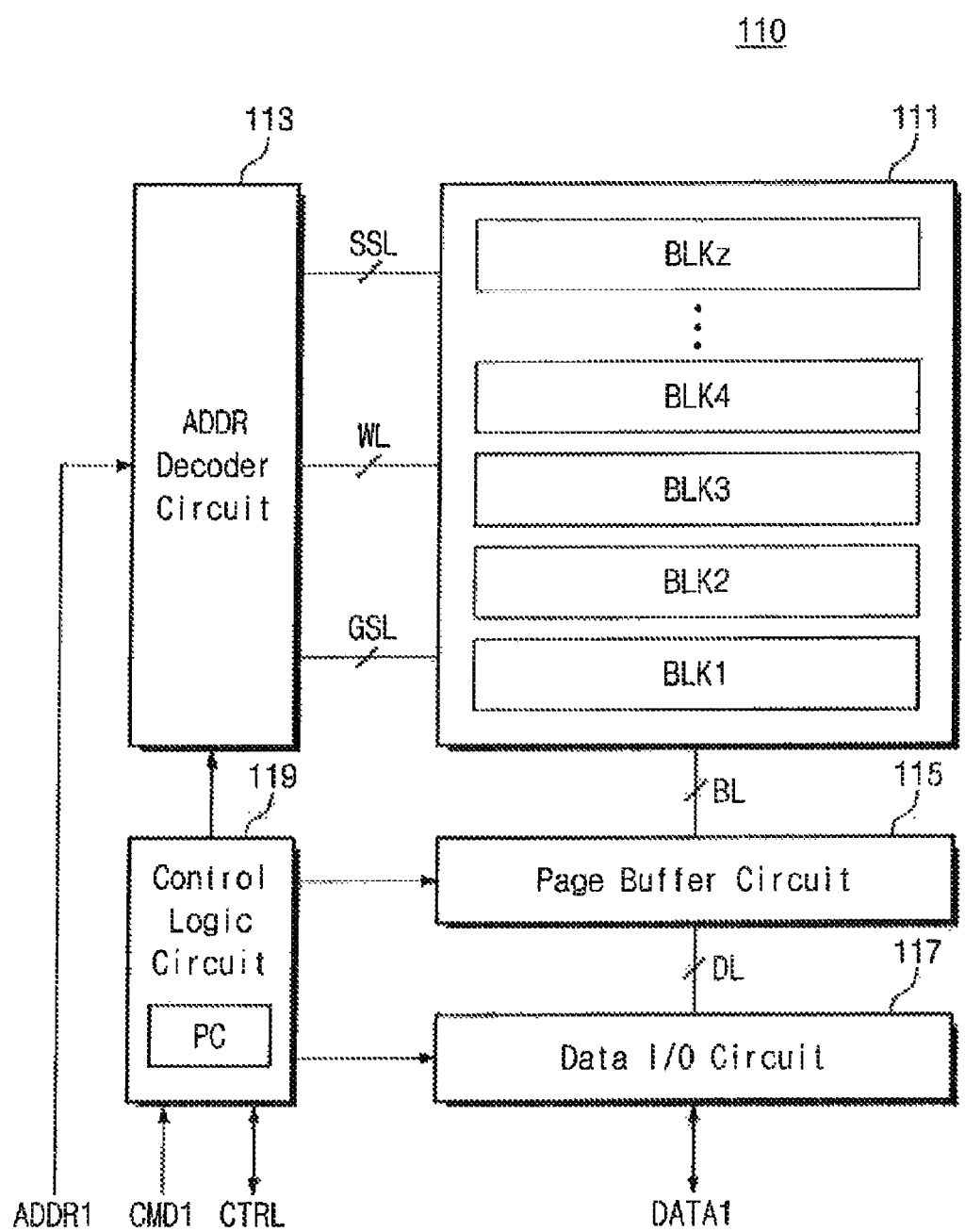
FIG. 1 is a block diagram illustrating a nonvolatile memory in accordance with an exemplary embodiment of the inventive concept.

The inventive concept will now be described more fully hereinafter with reference to the accompanying drawings, in which exemplary embodiments thereof are shown. This inventive concept may, however, be embodied in many different forms and should not be construed as limited to the embodiments set forth herein. In the drawings, the size and relative sizes of layers and regions may be exaggerated for clarity. Like numbers may refer to like elements throughout the attached drawings and written description.

FIG. 1 is a block diagram illustrating a nonvolatile memory 110 in accordance with an exemplary embodiment of the inventive concept. Referring to FIG. 1, the nonvolatile memory 110 includes a memory cell array 111, an address decoder circuit 113, a page buffer circuit 115, a data input/output circuit 117, and a control logic circuit 119.

The memory cell array 111 includes a plurality of memory blocks BLK1~BLKz, each of which has a plurality of memory cells. Each memory block may be connected to the address decoder circuit 113 through at least one ground select line GSL, a plurality of word lines WL, and at least one string select line SSL. Each memory block may be connected to the page buffer circuit 115 through a plurality of bit lines BL. The memory blocks BLK1~BLKz may be connected to the bit lines BL in common. Memory cells of the memory blocks BLK1~BLKz may have the same structures. Each of the memory blocks BLK1~BLKz may be an erase operation unit. Memory cells of the memory cell array 111 may be erased by one memory block unit. Memory cells that belong to the same memory block may be erased all at once. In an exemplary embodiment of the inventive concept, each memory block may be divided into a plurality of sub blocks. Each sub block may be an erase operation unit.

The address decoder circuit 113 is connected to the memory cell array 111 through a plurality of ground select lines GSL, a plurality of word lines WL, and a plurality of string select lines SSL. The address decoder circuit 113 operates according to a control of the control logic circuit 119. The address decoder circuit 113 can receive a first address ADDR1 from a memory controller. The address decoder circuit 113 decodes the received first address ADDR1 and controls voltages applied to word lines WL according to the decoded address.

For example, in a program operation, the address decoder circuit 113 may apply a program voltage VPGM to a selected word line of a selected memory block indicated by the first address ADDR1 and apply a pass voltage VPASS to unselected word lines of the selected memory block. In a read operation, the address decoder circuit 113 may apply a select read voltage VRD to a selected word line of a selected memory block indicated by the first address ADDR1 and apply an unselect voltage VREAD to unselected word lines of the selected memory block. In an erase operation, the address decoder circuit 113 may apply erase voltages (for example, a ground voltage or low voltages having a level similar to the ground voltage) to a selected word line of a selected memory block indicated by the first address ADDR1.

The page buffer circuit 115 is connected to the memory cell array 111 through a plurality of bit lines BL. The page buffer circuit 115 is connected to the data input/output circuit 117 through a plurality of data lines DL. The page buffer circuit 115 operates according to a control of the control logic circuit 119.

The page buffer circuit 115 can store data to be programmed in memory cells of the memory cell array 111 or data read from the memory cells of the memory cell array 111. In a program operation, the page buffer circuit 115 can store data to be programmed in the memory cells. The page buffer circuit 115 can bias the bit lines BL on the basis of the stored data. In a program operation, the page buffer circuit 115 can function as a write driver. In a read operation, the page buffer circuit 115 can sense voltages of the bit lines BL and store a sensing result. In a read operation, the page buffer circuit 115 can function as a sense amplifier.

The data input/output circuit 117 is connected to the page buffer circuit 115 through a plurality of data lines DL. The data input/output circuit 117 can exchange first data DATA1 with the memory controller.

The data input/output circuit 117 can temporarily store the first data DATA1 received from the memory controller. The data input/output circuit 117 can transmit the stored first data DATA1 to the memory controller. The data input/output circuit 117 can function as a buffer memory.

The control logic circuit 119 receives a first command CMD1 and a control signal CTRL from the memory controller. The control logic circuit 119 decodes the received first command CMD1 and can control an overall operation of the nonvolatile memory 110 according to the decoded command.

In a read operation, the control logic circuit 119 can generate a data strobe signal DQS from a read enable signal /RE among the received control signals CTRL and output the data strobe signal DQS. In a write operation, the control logic circuit 119 can receive a data strobe signal DQS included in the control signal CTRL.

The control logic circuit 119 includes a program control circuit PC. The program control circuit PC can control a program operation of the nonvolatile memory 110 by controlling the address decoder circuit 113 and the page buffer circuit 115. For example, the program control circuit PC can control the address decoder circuit 113 and the page buffer circuit 115 so that a program is performed according to a program method in accordance with an exemplary embodiment of the inventive concept.

FIG. 2 is a circuit diagram illustrating a memory block BLKa in accordance with an exemplary embodiment of the inventive concept. Referring to FIG. 2, the memory block BLKa includes a plurality of cell strings CS11~CS21 and CS12~CS22. The cell strings CS11~CS21 and CS12~CS22 may be arranged along a row direction and a column direction to form rows and columns.

For example, the cell strings CS11 and CS12 arranged along a row direction may form a first row and the cell strings CS21 and CS22 arranged along a row direction may form a second row. The cell strings CS11 and CS21 arranged along a column direction may form a first column and the cell strings CS12 and CS22 arranged along a column direction may form a second column.

Each cell string CS11~CS21 and CS12~CS22 may include a plurality of cell transistors. The cell transistors include ground select transistors GSTa and GSTb, memory cells MC1~MC6, and string select transistors SSTa and SSTb. The ground select transistors GSTa and GSTb, the memory cells MC1~MC6, and the string select transistors SSTa and SSTb of each cell string may be stacked in a direction perpendicular to a plane (for example, a plane corresponding to a surface of a substrate on which the memory block BLKa is formed) on which the cell strings CS11~CS21 and CS12~CS22 are arranged along rows and columns. For example, the transistors of a cell string may be stacked in the height direction.

The cell transistors may be charge trap type transistors having threshold voltages that change depending on an amount of charge captured by an insulating layer.

Sources of the lowermost ground select transistors GSTa may be connected to a common source line CSL in common.

Control gates of the ground select transistors GSTa and GSTb of the cell strings CS11~CS21 and CS12~CS22 may be connected to ground select lines GSLa and GSLb respectively. The ground select transistors of the same height (or order) may be connected to the same ground select line and the ground select transistors of different heights (or orders) may be connected to different ground select lines. For example, the ground select transistors GSTa of a first height are connected to the ground select line GSLa in common and the ground select transistors GSTb of a second height are connected to the ground select line GSLb in common.

Ground select transistors of the same row may be connected to the same ground select line and ground select transistors of different rows may be connected to different ground select lines. For example, the ground select transistors GSTa and GSTb of the cell strings CS11 and CS12 of the first row are connected to a first ground select line, and the ground select transistors GSTa and GSTb of the cell strings CS21 and CS22 of the second row are connected to a second ground select line.

Control gates of memory cells located at the same height (or order) from a substrate (or ground select transistors GST) may be connected to the same word line in common and control gates of memory cells located at different heights (or orders) from the substrate may be connected to different word lines WL1~WL6 respectively. For example, the memory cells M1 are connected to the word line WL1 in common. The memory cells M2 are connected to the word line WL2 in common. The memory cells M3 are connected to the word line WL3 in common. The memory cells M4 are connected to the word line WL4 in common. The memory cells M5 are connected to the word line WL5 in common. The memory cells M6 are connected to the word line WL6 in common.

At the first string select transistors SSTa of the same height (or order) of the cell strings CS11~CS21 and CS12~CS22, control gates of the first string select transistors SSTa of different rows are connected to different string select lines SSL1a~SSL2a respectively. For example, the first string select transistors SSTa of the cell strings CS11 and CS12 are connected to the string select line SSL1a in common. The first string select transistors SSTa of the cell strings CS21 and CS22 are connected to the string select line SSL2a in common.

At the second string select transistors SSTb of the same height (or order) of the cell strings CS11~CS21 and CS12~CS22, control gates of the second string select transistors SSTb of different rows are connected to different string select lines SSL1b~SSL2b respectively. For example, the second string select transistors SSTb of the cell strings CS11 and CS12 are connected to the string select line SSL1b in common. The second string select transistors SSTb of the cell strings CS21 and CS22 are connected to the string select line SSL2b in common.

Cell strings of different rows are connected to different string select lines. String select transistors of the same height (or order) of the cell strings of the same row are connected to the same string select line. String select transistors of different heights (or orders) of the cell strings of the same row are connected to different string select lines.

String select transistors of the cell strings of the same row may be connected to one string select line in common. For example, the string select transistors SSTa and SSTb of the cell strings CS11 and CS12 of the first row may be connected to one string select line in common. For example, the string select transistors SSTa may be connected to the string select line SSL1a in common and the string selected transistors SSTb may be connected to the string selected line SSL1b in common. The string select transistors SSTa and SSTb of the cell strings CS21 and CS22 of the second row may be connected to one string select line in common. For example, the string select transistors SSTa may be connected to the string select line SSL2a in common and the string selected transistors SSTb may be connected to the string selected line SSL2b in common.

Columns of the cell strings CS11~CS21 and CS12~CS22 are connected to different bit lines BL1 and BL2 respectively. For example, the string select transistors SSTb of the cell strings CS11 and CS21 of the first column are connected to a bit line BL1 in common. The string select transistors SSTb of the cell strings CS12 and CS22 of the second column are connected to a bit line BL2 in common.

The cell strings CS11 and CS12 may form a first plane. The cell strings CS21 and CS22 may form a second plane.

In the memory block BLKa, memory cells of each height of each plane may from a physical page. The physical page may be a read unit and a write unit of the memory cells MC1~MC6. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane are connected to the bit lines BL1 and BL2 respectively. In other words, the first plane is selected. When a turn-on voltage is supplied to the string select lines SSL2a and SSL2b and a turn-off voltage is supplied to the string select lines SSL1a and SSL1b, the cell strings CS21 and CS22 of the second plane are connected to the bit lines BL1 and BL2 respectively. In other words, the second plane is selected. In the selected plane, one row of the memory cells MC may be selected by the word lines WL1~WL6. In the selected row, a select voltage may be applied to the second word line WL2 and an unselect voltage may be applied to the remaining word lines WL1 and WL3~WL6. In other words, a physical page corresponding to the second word line WL2 of the second plane may be selected by controlling the string select lines SSL1a, SSL1b, SSL2a and SSL2b and the word lines WL1~WL6. In the memory cells MC2 of the selected physical page, a write or read operation may be performed.

In the memory block BLKa, an erase operation of the memory cells MC1~MC6 may be performed by a memory block unit or a sub block unit. When an erase operation is performed by a memory block unit, memory cells MC of the memory block BLKa may be erased all at once according to an erase request (for example, an erase request from an external memory controller). When an erase operation is performed by a sub block unit, parts of the memory cells MC1~MC6 of the memory block BLKa may be erased all at once according to an erase request (for example, an erase request from an external memory controller) and the remaining parts may be erase-prohibited. A low voltage (for example, a ground voltage or a voltage having a level similar to the ground voltage) may be supplied to a word line connected to the memory cells being erased and a word line connected to the erase-prohibited memory cells may be floated.

The memory block BLKa illustrated in FIG. 2 is illustrative. The inventive concept is not limited to the memory block BLKa illustrated in FIG. 2. For example, the number of rows of cell strings may be increased or decreased. As the number of rows of cell strings is changed, the number of string select lines or ground select lines connected to the rows of the cell strings and the number of cell strings connected to one bit line may also be changed.

The number of columns of cell strings may be increased or decreased. As the number of columns of cell strings is changed, the number of bit lines connected to the columns of the cell strings and the number of cell strings connected to one string select line may also be changed.

Heights of cell strings may be increased or decreased. For example, the number of ground select transistors, memory cells or string select transistors that are included in each cell string may be increased or decreased.

Memory cells MC that belong to one physical page can correspond to at least three logical pages. For example, k (k is an integer greater than 2) number of bits can be programmed in one memory cell MC. In memory cells MC that belong to one physical page, k number of bits programmed in each memory cell MC can form k number of logical pages respectively.

In an exemplary embodiment of the inventive concept, a three dimensional (3D) memory array is provided. The 3D memory array is monolithically formed in one or more physical levels of arrays of memory cells having an active area disposed above a silicon substrate and circuitry associated with the operation of those memory cells. Such associated circuitry may be above or within such substrate. The term "monolithic" may mean that layers of each level of the array are directly deposited on the layers of each underlying level of the array.

In an exemplary embodiment of the inventive concept, the 3D memory array includes vertical NAND strings that are vertically oriented such that at least one memory cell is located over another memory cell. The at least one memory cell may comprise a charge trap layer. Each vertical NAND string further includes at least one select transistor located over the memory cells, the at least one select transistor having the same structure as the memory cells and being formed monolithically together with the memory cells.

The following patent documents U.S. Pat. Nos. 7,679,133; 8,553,466; 8,654,587; 8,559,235; and U.S. Pat. Pub. No. 2011/0233648, which are incorporated by reference herein in their entireties, describe configurations of three-dimensional memory arrays for use in accordance with an exemplary embodiment of the inventive concept. In the aforementioned patent documents, a three-dimensional memory array is configured as a plurality of levels, with word lines and/or bit lines shared between levels.

Figure 3:
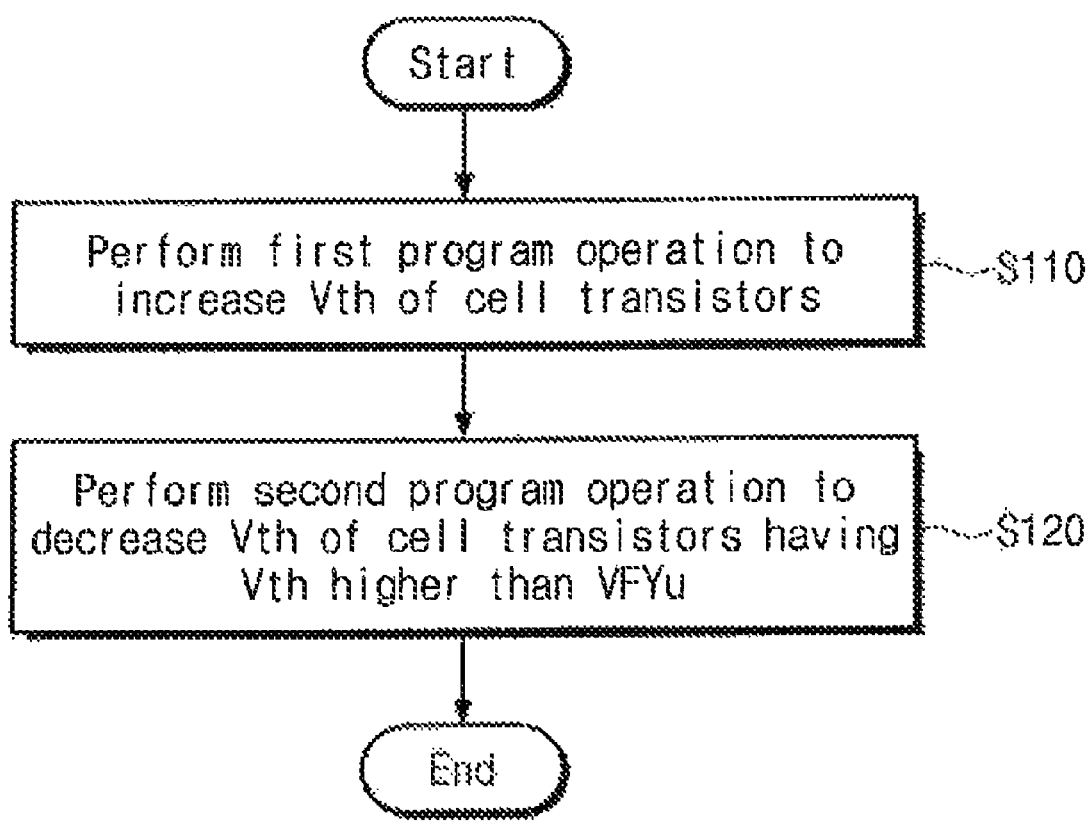
FIG. 3 is a flowchart illustrating an operating method of a nonvolatile memory in accordance with an exemplary embodiment of the inventive concept.

FIG. 3 is a flowchart illustrating an operating method of a nonvolatile memory in accordance with an exemplary embodiment of the inventive concept. Referring to FIGS. 1 through 3, in step S110, a first program operation is performed and thereby threshold voltages of cell transistors increase. For example, the threshold voltages of cell transistors (e.g., all cell transistors) selected as a program target may increase. The program control circuit PC can control voltages applied to the memory cell array 110 so that threshold voltages of cell transistors increase.

In step S120, a second program operation is performed and thereby threshold voltages of cell transistors having threshold voltages higher than a verify voltage VFYu may decrease. For example, among cell transistors on which the first program operation is performed, cell transistors having threshold voltages higher than the verify voltage VFYu may be programmed such that their threshold voltages decrease through the second program operation. The verify voltage VFYu may be an upper limit of a target threshold voltage range of cell transistors. The program control circuit PC can control voltages applied to the memory cell array 111 so that threshold voltages of cell transistors having threshold voltages higher than the verify voltage VFYu decrease.

Figure 4:
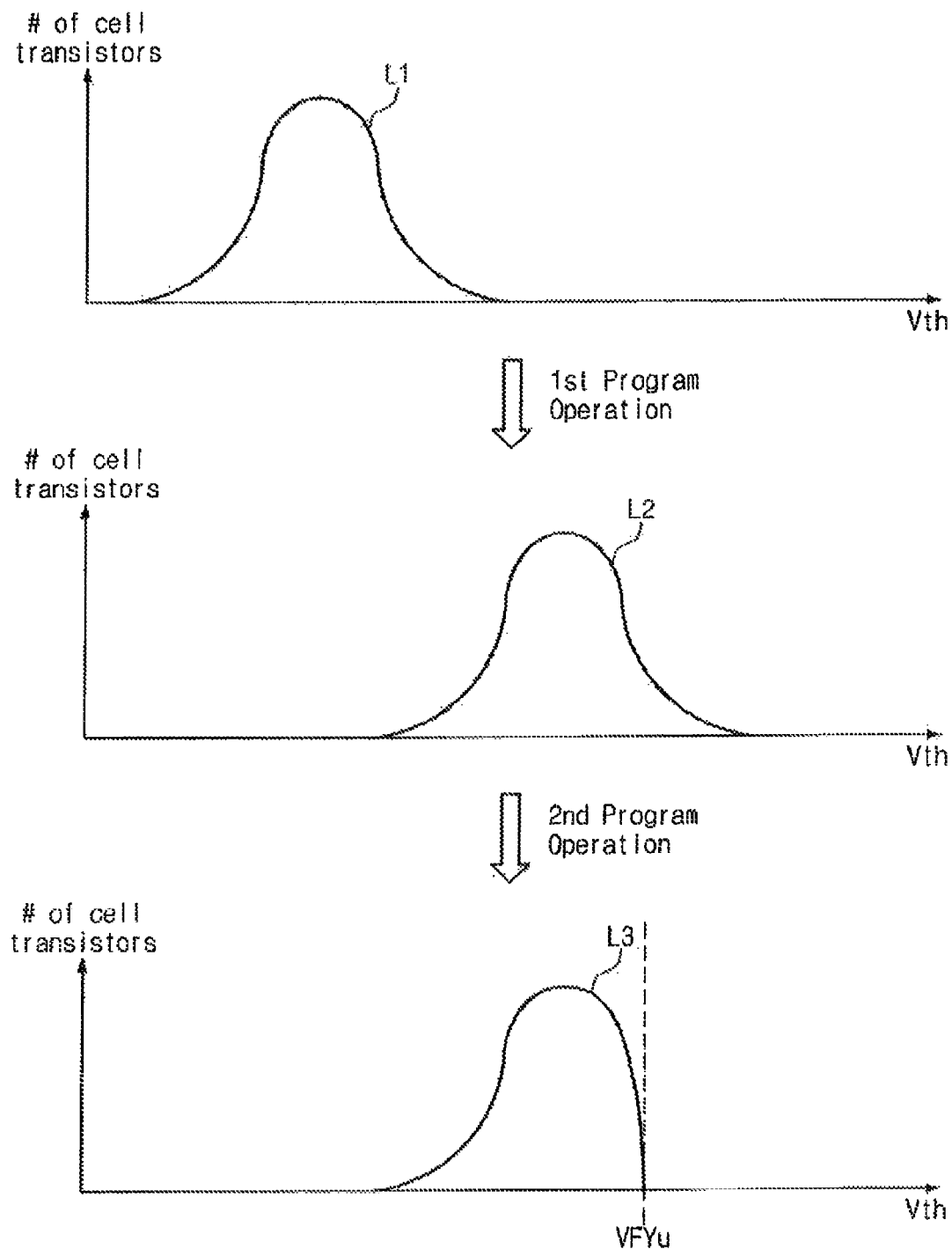
FIG. 4 illustrates changes of threshold voltages of cell transistors in the operating method of FIG. 3, according to an exemplary embodiment of the inventive concept.

FIG. 4 illustrates changes of threshold voltages of cell transistors in the operating method of FIG. 3, according to an exemplary embodiment of the inventive concept. In FIG. 4, a horizontal axis indicates threshold voltages of cell transistors and a vertical axis indicates the number of cell transistors. In other words, FIG. 4 shows a threshold voltage distribution of the cell transistors.

Referring to FIGS. 1 through 4, an initial threshold voltage distribution of the cell transistors may be indicated by a first line L1.

If the first program operation of the step S110 is performed, threshold voltages of the cell transistors increase. For example, a threshold voltage distribution of the cell transistors may change from the first line L1 to a second line L2 through the first program operation.

If the second program operation of the step S120 is performed, threshold voltages of cell transistors higher than the verify voltage VFYu decrease. For example, the threshold voltages of cell transistors higher than the verify voltage VFYu may become lower than the verify voltage VFYu. In other words, a threshold voltage distribution of the cell transistors may change from the second line L2 to a third line L3 through the second program operation.

As described above, if the first and second program operations are performed, a threshold voltage distribution of the cell transistors is reduced and threshold voltages of the cell transistors are limited to a level lower than the verify voltage VFYu. For example, a width of threshold voltage distribution identified by L3 is less than that of L2. Since threshold voltages of the cell transistors are controlled within the target range, reliability of the nonvolatile memory 110 including cell transistors is increased.

Figures 5, 6:
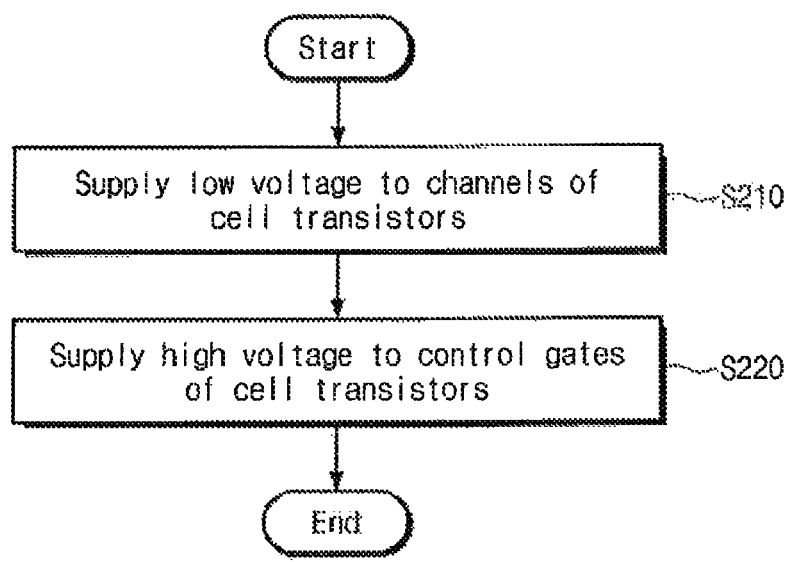
FIG. 5 is a flowchart illustrating a first program operation, according to an exemplary embodiment of the inventive concept.
FIG. 6 is a table illustrating voltages supplied to a memory block in the first program operation, according to an exemplary embodiment of the inventive concept.

FIG. 5 is a flowchart illustrating a first program operation, according to an exemplary embodiment of the inventive concept. Referring to FIGS. 1, 2 and 5, in step S210, a low voltage is supplied to channels of cell transistors. For example, a ground voltage or a low voltage having a level similar to the ground voltage may be supplied to channels of cell transistors selected as a program target.

In step S220, a high voltage is supplied to control gates of the cell transistors. For example, a high voltage having a level that can cause Fowler-Nordheim (F-N) tunneling may be supplied to control gates of the cell transistors selected as a program target.

Due to a voltage difference between the low voltage supplied to the channels of the cell transistors and the high voltage supplied to the control gate of the cell transistors, F-N tunneling occurs in the cell transistors. Thus, electrons are trapped in the cell transistors and threshold voltages of the cell transistors may increase.

In the first program operation, cell transistors may be programmed by a word line unit. For example, in the first program operation, threshold voltages of memory cells that belong to physical pages connected to the same word line may increase.

FIG. 6 is a table illustrating voltages supplied to a memory block BLKa in the first program operation, according to an exemplary embodiment of the inventive concept. An example of voltages when memory cells MC are selected as a program target is illustrated in FIG. 6.

Referring to FIGS. 2 and 6, first bit line voltages VBL1 are applied to the bit lines BL1 and BL2. The first bit line voltages VBL1 may be a ground voltage or low voltages having a level similar to the ground voltage.

First string select line voltages VSSL1 are applied to the string select lines SSL1a, SSL1b, SSL2a and SSL2b. The first string select line voltages VSSL1 may be a voltage that turns on the string select transistors SST1a, SST1b, SST2a and SST2b. SST1a and SST1b correspond to the string select transistors connected to cell string CS11 and SST2a and SST2b correspond to the string select transistors connected to cell string CS12. The first string select line voltages VSSL1 may be a power supply voltage or high voltages having a level similar to or higher than the power supply voltage.

First pass voltages VPASS1 are applied to unselected word lines. The first pass voltages VPASS1 may be voltages that turn on memory cells connected to the unselected word lines. The first pass voltages VPASS1 may be a power supply voltage or high voltages having a level similar to or higher than the power supply voltage.

A first program voltage VPGM1 is applied to a selected word line. The first program voltage VPGM1 may be a high voltage higher than the first pass voltages VPASS1.

First ground select line voltages VGSL1 are applied to the ground select lines GSLa and GSLb. The first ground select line voltages VGSL1 may be voltages that turn on the ground select transistors GSTa and GSTb. The first ground select line voltages VGSL1 may be a power supply voltage or high voltages having a level similar to or higher than the power supply voltage.

A first common source line voltage VCSL1 is applied to the common source line CSL. The first common source line voltage VCSL1 may be a ground voltage or a low voltage having a level similar to the ground voltage.

In this case, the memory cells MC3 connected to the third word line WL3 are selected as a program target of the first program operation. Since the first pass voltages VPASS1 are applied to the first word line WL1, the second word line WL2 and the fourth through sixth word lines WL4~WL6, the first memory cells MC1, the second memory cells MC2 and the fourth through sixth memory cells MC4~MC6 are turned on. Since the first string select line voltages VSSL1 are applied to the string select lines SSL1a, SSL1b, SSL2a and SSL2b, the string select transistors SST1a, SST1b, SST2a and SST2b are turned on. Since the first ground select line voltages VGSL1 are applied to the ground select lines GSLa and GSLb, the ground select transistors GSTa and GSTb are turned on. Since the first program voltage VPGM1 is applied to the third word line WL3, the third memory cells MC3 are turned on.

Since the first bit line voltages VBL1 are provided to the bit lines BL1 and BL2, low voltages are supplied to drains of the third memory cells MC3 through the string select transistors SST1a, SST1b, SST2a and SST2b and the fourth through sixth memory cells MC4~MC6. In addition, the first common source line voltage VCSL1 supplied to the common source line CSL is supplied to sources of the third memory cells MC3 through the ground select transistors GSTa and GSTb and the first and second memory cells MC1 and MC2.

As described with reference to FIG. 5, low voltages are supplied to channels of the third memory cell MC3 selected as a target of the first program operation and a high voltage is supplied to control gates of the third cell MC3. Thus, threshold voltages of the third memory cell MC3 rise.

FIG. 7 is a table illustrating voltages supplied to a memory block BLKa in the first program operation, according to an exemplary embodiment of the inventive concept. An example of voltages of when the ground select transistors GSTa are selected as a program target is illustrated in FIG. 7.

Referring to FIGS. 2 and 7, second bit line voltages VBL2 are applied to the bit lines BL1 and BL2. The second bit line voltages VBL2 may be a ground voltage or low voltages having a level similar to the ground voltage.

Second string select line voltages VSSL2 are supplied to the string select lines SSL1a, SSL1b, SSL2a and SST2b. The second string select line voltages VSSL2 may be voltages that turn on the string select transistors SST1a, SST1b, SST2a and SST2b. The second string select line voltages VSSL2 may be a power supply voltage or high voltages having a level similar to or high than the power supply voltage.

Second pass voltages VPASS2 are applied to the word lines WL1~WL6. The second pass voltages VPASS2 may be voltages that turn on memory cells connected to the word lines WL1~WL6. The second pass voltages VPASS2 may be a power supply voltage or high voltages having a level similar to or high than the power supply voltage.

A second ground select line voltage VGSL2 is applied to an unselected ground select line. The second ground select line voltage VGSL2 may be a voltage that turns on the ground select transistors GST. The second ground select line voltage VGSL2 may be a power supply voltage or a high voltage having a level similar to or high than the power supply voltage.

A second program voltage VPGM2 is applied to a selected ground select line. The second program voltage VPGM2 may be a high voltage higher than the second pass voltages VPASS2.

A second common line voltage VCSL2 is applied to the common source line CSL. The second common line voltage VCSL2 may be a ground voltage or a low voltage having a level similar to the ground voltage.

In this case, the ground select transistors GSTa connected to the ground select line GSLa are selected as a program target of the first program operation. Since the second pass voltages VPASS2 are applied to the first through sixth word lines WL1~WL6, the first through sixth memory cells MC1~MC6 are turned on. Since the second ground select line voltage VGSL2 is applied to the ground select line GSLb, the ground select transistors GSTb are turned on. Since the second program voltage VPGM2 is applied to the ground select line GSLa, the ground select transistors GSTa are turned on.

Since, the second bit line voltages VBL2 are provided to bit lines BL1 and BL2, low voltages are supplied to drains of the ground select transistors GSTb through the string select transistors SST1a, SST1b, SST2a and SST2b and the first through sixth memory cells MC1~MC6. In addition, the second common source line voltage VCSL2 supplied to the common source line CSL is supplied directly to sources of the ground select transistors GSTa.

As described with reference to FIG. 5, low voltages are supplied to channels of the ground select transistors GSTa selected as a target of the first program operation and a high voltage is supplied to control gates of the ground select transistors GSTa. Thus, F-N tunneling occurs in the ground select transistors GSTa and threshold voltages of the ground select transistors GSTa rise.

The ground select transistors GSTb are programmed in a similar manner. For example, low voltages supplied to the bit lines BL1 and BL2 are transmitted to drains of the ground select transistors GSTb through cell transistors of a drain side of the ground select transistors GSTb, in other words, the string select transistors SST1a, SST1b, SST2a and SST2b and the memory cells MC1~MC6. Low voltages supplied to the common source line CSL are supplied to sources of the ground select transistors GSTb through cell transistors of a source side of the ground select transistor GSTb, in other words, the ground select transistors GSTa. If a high voltage is supplied to control gates of the ground select transistors GSTb, threshold voltages of the ground select transistors GSTb rise.

Figure 8:
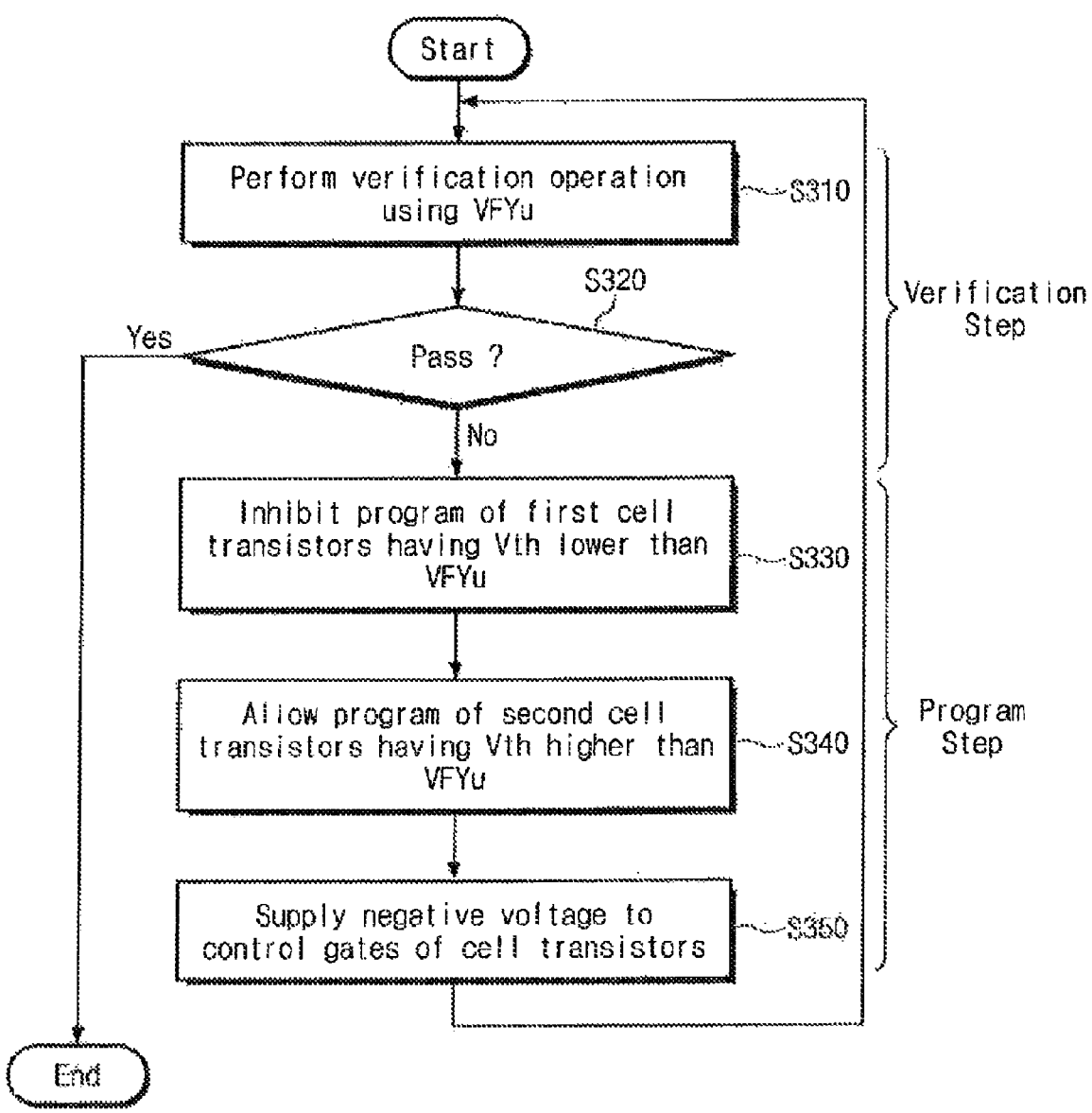
FIG. 8 is a flowchart illustrating a second program operation, according to an exemplary embodiment of the inventive concept.

FIG. 8 is a flowchart illustrating a second program operation, according to an exemplary embodiment of the inventive concept. Referring to FIGS. 1 through 3 and 8, in step S310, a verify operation is performed using a verify voltage VFYu. For example, a verify operation may be performed on cell transistors on which a first program operation is performed. The verify operation may be performed by a physical page unit on the cell transistors on which the first program operation is performed. If the verify operation is performed, among the cell transistors on which the first program operation is performed, first cell transistors having threshold voltages lower than the verify voltage VFYu and second cell transistors having threshold voltages higher than the verify voltage VFYu may be distinguished from each other.

In step S320, it is determined whether the verify operation has passed. For example, in the case that the second cell transistors having threshold voltages higher than the verify voltage VFYu do not exist or the number of the second cell transistors is less than a predetermined value, the verify operation may be determined to have passed.

If the verify operation passes, the second program operation may be finished. If the verify operation does not pass, step S330 is performed.

In the step S330, a program of the first cell transistors having threshold voltages lower than the verify voltage VFYu is inhibited. In step S340, a program of the second transistors having threshold voltages higher than the verify voltage VFYu is allowed. For example, a program may be inhibited or allowed by differently controlling voltages supplied to the first transistors and voltages supplied to the second transistors. After that, in step S350, a negative voltage is supplied to control gates of the first and second cell transistors.

The steps S310 and S320 may form a verify step. The steps S330 through S350 may form a program step. The verify step and the program step may be repeatedly performed until a result of the verify operation of the step S310 is determined to have passed. In other words, the verify step and the program step may be repeatedly performed until threshold voltages of the cell transistors are equal to or lower than the verify voltage VFYu.

While the verify step and the program step are repeatedly performed, levels of voltages being applied to the cell strings CS11, CS12, CS21 and CS22 of the memory block BLKa may be changed.

FIG. 9 is a table illustrating voltages supplied to a memory block in the second program operation, according to an exemplary embodiment of the inventive concept. An example of when a second program is performed on the memory cells MC is illustrated in FIG. 9.

Referring to FIGS. 2 and 9, a third bit line voltage VBL3 is applied to a selected bit line. The third bit line voltage VBL3 may be a power supply voltage or a high voltage having a level similar to or higher than the power supply voltage. A fourth bit line voltage VBL4 is applied to an unselected bit line. The fourth bit line voltage VBL4 may be a ground voltage or a low voltage having a level similar to the ground voltage.

Third string select line voltages VSSL3 are applied to selected string select lines. The third string select line voltages VSSL3 may be voltages that turn on string select transistors. The third string select line voltages VSSL3 may be a power supply voltage or high voltages having a level similar to or higher than the power supply voltage. The third string select line voltages VSSL3 may have substantially the same levels as the third bit line voltage VBL3. Fourth string select line voltages VSSL4 are applied to an unselected string select line. The fourth string select line voltages VSSL4 may be a power supply voltage or high voltages higher than the third string select line voltages VSSL3. The fourth string select line voltages VSSL4 may be high voltages. These high voltages may prevent boosting.

A third program voltage VPGM3 is applied to a selected word line. The third program voltage VPGM3 may be a negative voltage.

Third pass voltages VPASS3 are applied to unselected word lines. The third pass voltages VPASS3 may be voltages that turn on memory cells. The third pass voltages VPASS3 may be a power supply voltage or high voltages higher than the third string select line voltages VSSL3.

Third ground select line voltages VGSL3 are applied to the ground select lines GSLa and GSLb. The third ground select line voltages VGSL3 may be voltages that turn on the ground select transistors GSTa and GSTb. The third ground select line voltages VGSL3 may be a power supply voltage or high voltages having a level similar to or higher than the power supply voltage.

A third common source line voltage VCSL3 is applied to the common source line CSL. The third common source line voltage VCSL3 may be a ground voltage or a low voltage having a level similar to the ground voltage.

As described with reference to FIG. 6, the first program operation is performed on the memory cells MC3 connected to the third word line WL3. In addition, among the third memory cells MC3, a threshold voltage of the third memory cell MC3 that belongs to the cell string CS11 is higher than the verify voltage VFYu and threshold voltages of the third memory cells MC3 that belong to the remaining cell strings CS12, CS21 and CS22 are lower than the verify voltage VFYu. In other words, the string select lines SSL1a and SSL1b and the bit line BL1 that correspond to the cell string CS11 are selected and the string select lines SSL2a and SSL2b and the bit line BL2 that do not correspond to the cell string CS11 are unselected.

Figure 10:
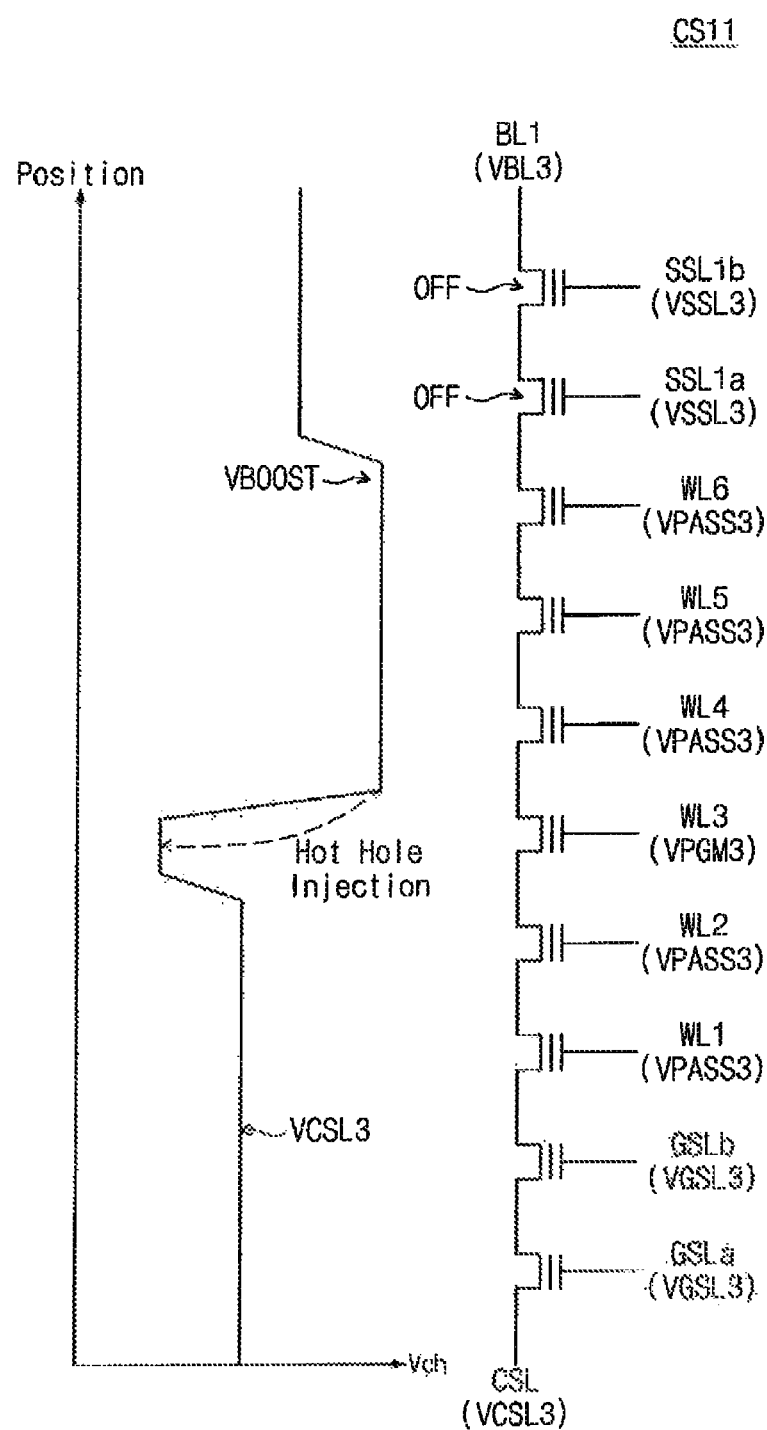
FIG. 10 illustrates voltages applied to a selected cell string in the second program operation, according to an exemplary embodiment of the inventive concept.

FIG. 10 illustrates voltages applied to a cell string CS11 selected in the second program operation, according to an exemplary embodiment of the inventive concept. In FIG. 10, the cell string CS11 is illustrated in a right side and a voltage (or potential) graph of channels of cell transistors of the cell string CS11 is illustrated in a left side. In the voltage (or potential) graph, a horizontal axis indicates a channel voltage Vch and a vertical axis indicates a location (Position) of cell transistors.

Referring to FIGS. 2, 9 and 10, the third program voltage VPGM3 which is a negative voltage is applied to the selected third word line WL3. Thus, the third memory cell MC3 is turned off. For example, a channel of the third memory cell MC3 has a first type (for example, p-type). Due to a coupling between a control gate and a channel of the third memory cell MC3, a voltage (or potential) of the channel of the third memory cell MC3 may decrease.

The third string select line voltages VSSL3 are applied to the selected string select lines SSL1a and SSL1b. In an initial state when the third string select line voltages VSSL3 are applied, the selected string select lines SSL1a and SSL1b may be turned on.

The third bit line voltage VBL3 is supplied to the selected first bit line BL1. The third bit line voltage VBL3 may be transmitted to a drain of the memory cells MC6 through channels of the selected string select transistors SST1a and SST1b which are turned on.

If the third pass voltages VPASS3 are applied to the fourth through sixth word lines WL4~WL6, the fourth through sixth memory cells MC4~MC6 are turned on. For example, channels of the fourth through sixth memory cells MC4~MC6 have a second type (for example, n-type). Since the third memory cell MC3 is turned off, a voltage transmitted from the selected bit line BL1 to a drain of the sixth memory cell MC6 is transmitted to the channels of the fourth through sixth memory cells MC4~MC6.

After the fourth through sixth memory cells MC4~MC6 are turned on, as voltages of control gates of the fourth through sixth memory cells MC4~MC6 rise to target levels of the third pass voltages VPASS3, a coupling occurs between control gates and channels of the fourth through sixth memory cells MC4~MC6. Due to the coupling, voltages (or potentials) of the channels of the fourth through sixth memory cells MC4~MC6 may be higher than a voltage supplied from the selected first bit line BL1 to a drain of the sixth memory cell MC6. At this time, the string select transistors SST1a and SST1b are turned off. In other words, channels of the fourth through sixth memory cells MC4~MC6 are isolated from the first bit line BL1 and floated between the third memory cell MC3 which is turned off and the string select transistors SST1a and SST1b which are turned off.

For example, the third string select line voltages VSSL3 and the third bit line voltage VBL3 may have substantially the same level. At this time, a voltage being transmitted to a drain of the memory cell MC6 may have a level obtained by subtracting threshold voltages of the string select transistors SST1a and SST1b from the third string select line voltages VSSL3 or the third bit line voltage VBL3. In this case, if a drain voltage of the sixth memory cell MC6 rises, a turn on condition of the string select transistors SST1a and SST1b is not satisfied and thereby the string select transistors SST1a and SST1b are turned off.

After the string select transistors SST1a and SST1b are turned off, voltages of the channels of the fourth through sixth memory cells MC4~MC6 further rise due to a coupling effect. In other words, channels of the fourth through sixth memory cells MC4~MC6 are floated and voltages (or potentials) of the floated channels are boosted. For example, the voltages of the channels of the fourth through sixth memory cells MC4~MC6 may increase to a boost voltage VBOOST. In other words, the boost voltage VBOOST is supplied to a drain of the selected third memory cell MC3.

As the third pass voltages VPASS3 are supplied to the first and second word lines WL1 and WL2 and the third ground select line voltages VGSL3 are supplied to the ground select lines GSLa and GSLb, the ground select transistors GSTa and GSTb and the first and second memory cells MC1 and MC2 are turned on. Thus, the third common source line voltage VCSL3 supplied to the common source line CSL is transmitted to a source of the selected third memory cell MC3 through the ground select transistors GSTa and GSTb and the first and second memory cells MC1 and MC2.

Due to a voltage difference between the boost voltage VBOOST supplied to the drain of the third memory cell MC3 and the third common source line voltage VCSL3 supplied to the source of the third memory cell MC3, a hot hole appears around/in the third memory cell MC3. Due to the third program voltage VPGM3 which is a negative voltage being applied to the control gate of the third memory cell MC3, a hot hole is injected into the third memory cell MC3. In other words, a threshold voltage of the third memory cell MC3 is reduced.

While the verify step and the program step of FIG. 8 are repeatedly performed, a level of the third program voltage VPGM3 may gradually increase or decrease. While the verify step and the program step of FIG. 8 are repeatedly performed, levels of the third pass voltages VPASS are gradually increased or decreased and thereby a level of the boost voltage VBOOST may gradually increase or decrease.

Figure 11:
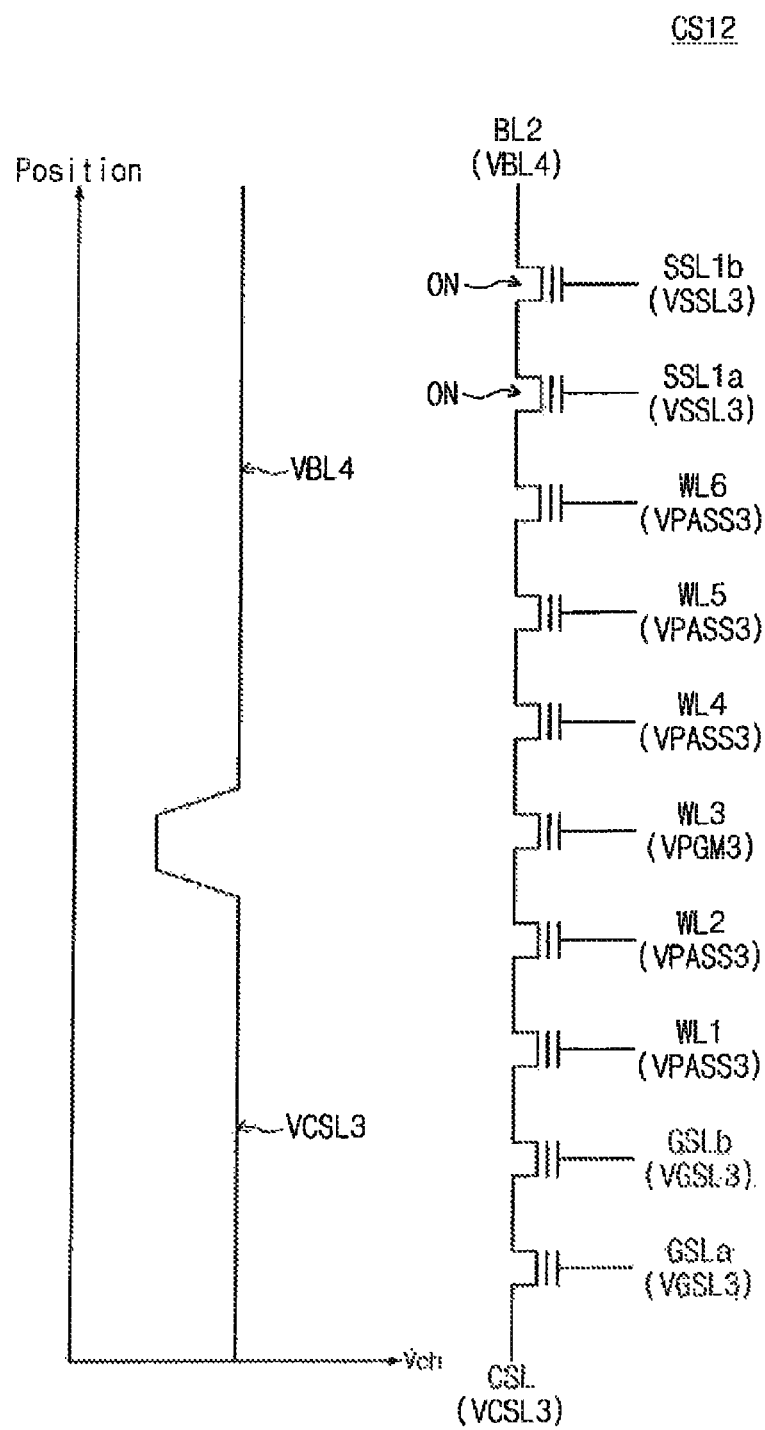
FIG. 11 illustrates voltages applied to unselected cell strings in the second program operation, according to an exemplary embodiment of the inventive concept.
Figure 12:
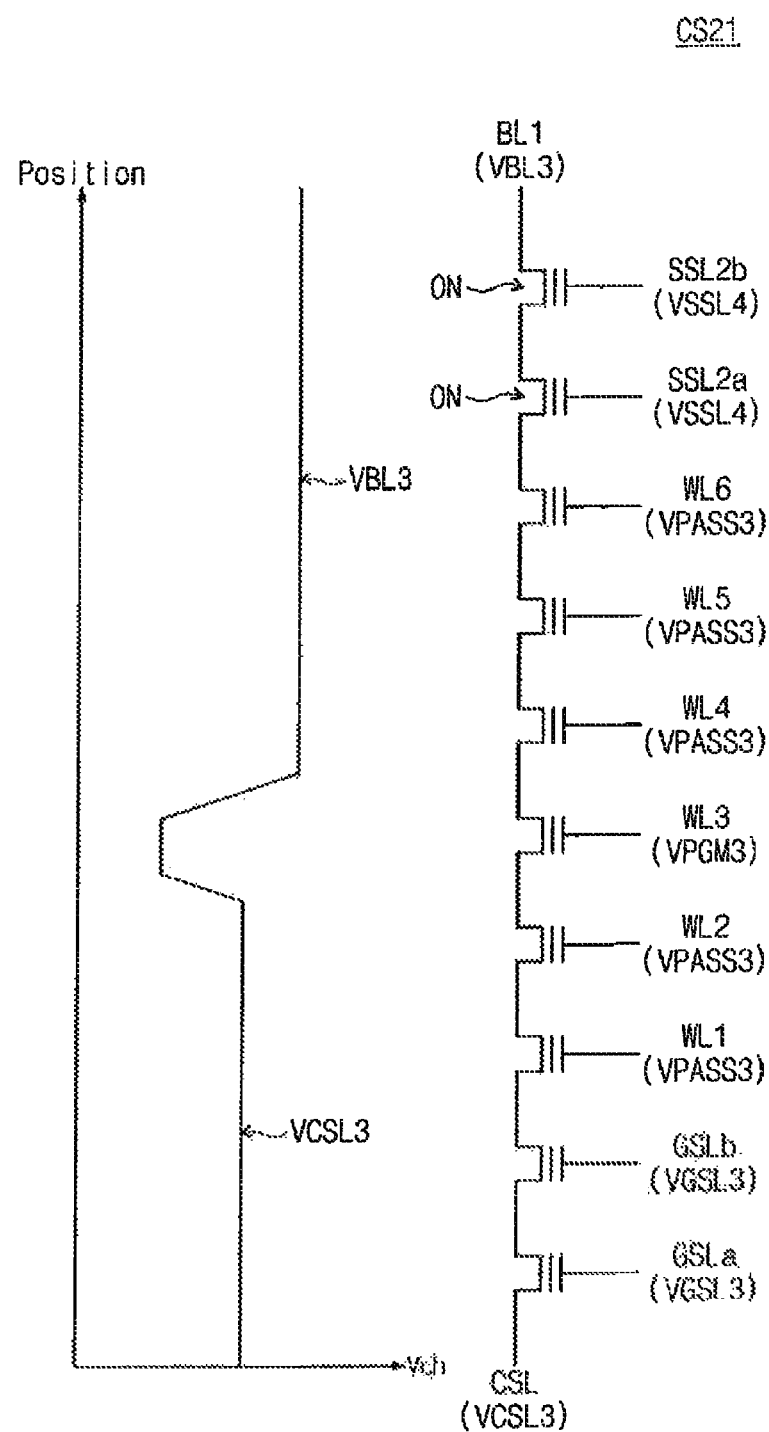
FIG. 12 illustrates voltages applied to unselected cell strings in the second program operation, according to an exemplary embodiment of the inventive concept.
Figure 13:
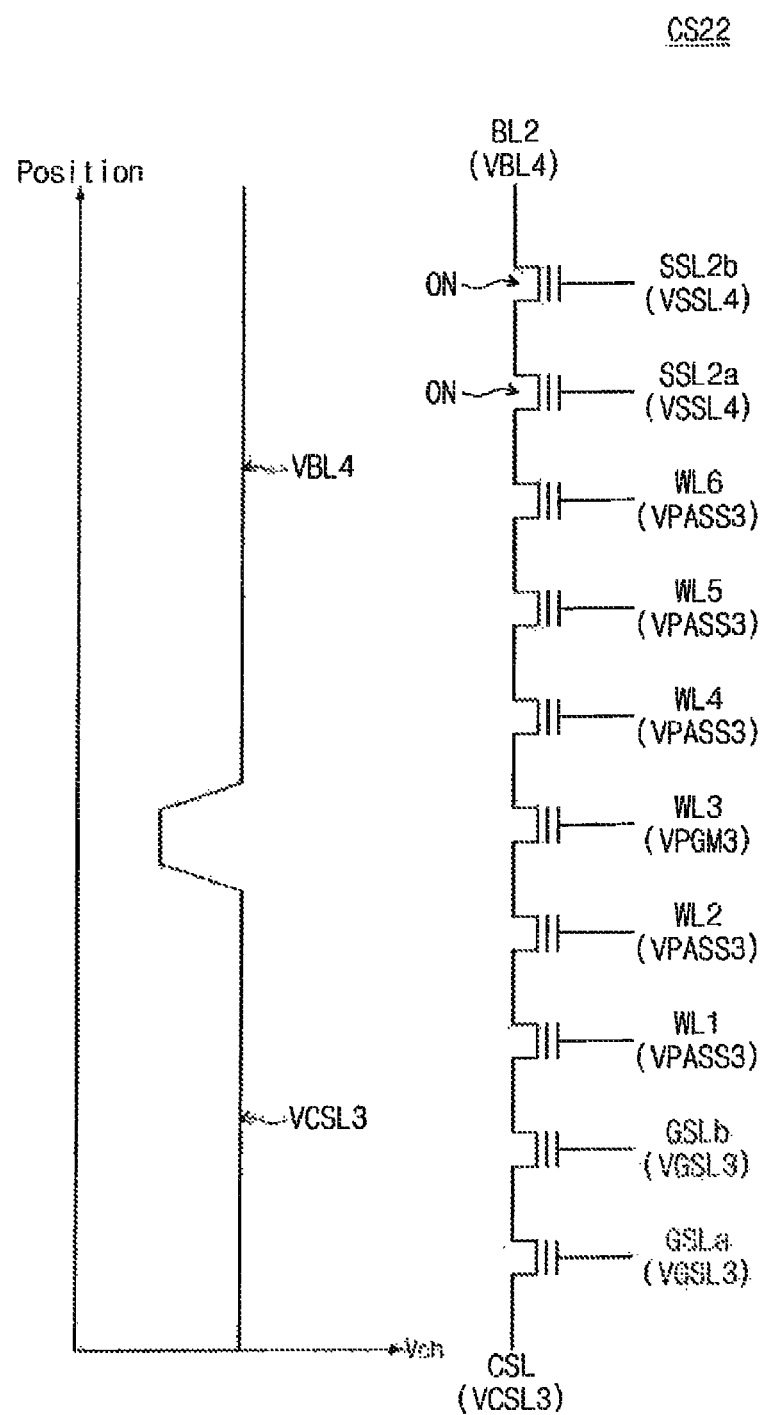
FIG. 13 illustrates voltages applied to unselected cell strings in the second program operation, according to an exemplary embodiment of the inventive concept.

FIGS. 11 through 13 illustrate voltages applied to cell strings CS12, CS21 and CS22 unselected in the second program operation, according to exemplary embodiments of the inventive concept. In FIGS. 11 through 13, the cell strings CS12, CS21 and CS22 are illustrated in a right side and voltage (or potential) graphs of channels of cell transistors of the cell strings CS12, CS21 and CS22 are illustrated in a left side. In each voltage (or potential) graph, a horizontal axis indicates a voltage of the channels Vch and a vertical axis indicates a location (Position) of the cell transistors.

Referring to FIGS. 2, 9 and 11, in the unselected cell string CS12, the third program voltage VPGM3 which is a negative voltage is applied to the selected third word line WL3. Thus, the third memory cell MC3 is turned off.

The third string select line voltages VSSL3 are applied to the selected string select lines SSL1a and SSL1b. Thus, the string select transistors SST1a and SST1b are turned on. The third pass voltages VPASS3 are supplied to the fourth through sixth word lines WL4~WL6. Thus, the fourth through sixth memory cells MC4~MC6 are turned on.

The fourth bit line voltage VBL4 is supplied to the unselected second bit line BL2. The fourth bit line voltage VBL4 is supplied to channels of the fourth through sixth memory cells MC4~MC6 through the string select transistors SSTa and SSTb. Since the fourth bit line voltage VBL4 is a low voltage, if a coupling occurs in control gates of the fourth through sixth memory cells MC4~MC6, a voltage of the channels of the fourth through sixth memory cells MC4~MC6 does not increase to turn off the string select transistors SSTa and SSTb. Thus, the boosting described with reference to FIG. 10 does not occur and the voltage of the channels of the fourth through sixth memory cells MC4~MC6 becomes the fourth bit line voltage VBL4.

As the third pass voltages VPASS3 are supplied to the first and second word lines WL1 and WL2 and the third ground select line voltages VGSL3 are applied to the ground select lines GSLa and GSLb, the ground select transistors GSTa and GSTb and the first and second memory cells MC1 and MC2 are turned on. Thus, the third common source line voltage VCSL3 supplied to the common source line CSL is transmitted to a source of the selected third memory cell MC3 through the ground select transistors GSTa and GSTb and the first and second memory cells MC1 and MC2.

A voltage difference between the fourth bit line voltage VBL4 supplied to a drain of the third memory cell MC3 and the third common source line voltage VSL3 supplied to a source of the third memory cell MC3 does not cause a hot hole. In other words, in the unselected cell string CS12, a program of the third memory cell MC3 is inhibited by preventing a boosting of a drain voltage of the third memory cell MC3.

Referring to FIGS. 2, 9 and 12, in the unselected cell string CS21, the third program voltage VPGM3 which is a negative voltage is applied to the selected third word line WL3. Thus, the third memory cell MC3 is turned off.

The fourth string select line voltages VSSL4 are applied to the unselected string select lines SSL2a and SSL2b. Thus, the string select transistors SSTa and SSTb are turned on. The third pass voltages VPASS3 are supplied to the fourth through sixth word lines WL4~WL6. Thus, the fourth through sixth memory cells MC4~MC6 are turned on.

The third bit line voltage VBL3 is supplied to the selected first bit line BL1. The third bit line voltage VBL3 is supplied to channels of the fourth through sixth memory cells MC4~MC6 through the string select transistors SSTa and SSTb. The fourth string select line voltages VSSL4 are high voltages higher than the third string select line voltage VSSL3. For example, the fourth string select line voltages VSSL4 may be set to be high enough so that when voltages of the channels of the fourth through sixth memory cells MC4~MC6 increase due to a coupling from control gates, the string select transistors SSTa and SSTb are not turned off. Thus, the boosting described with reference to FIG. 10 does not occur and the voltages of the channels of the fourth through sixth memory cells MC4~MC6 become the third bit line voltage VBL3.

As the third pass voltages VPASS3 are supplied to the first and second word lines WL1 and WL2 and the third ground select line voltages VGSL3 are applied to the ground select lines GSLa and GSLb, the ground select transistors GSTa and GSTb and the first and second memory cells MC1 and MC2 are turned on. Thus, the third common source line voltage VCSL3 supplied to the common source line CSL is transmitted to a source of the selected third memory cell MC3 through the ground select transistors GSTa and GSTb and the first and second memory cells MC1 and MC2.

A voltage difference between the third bit line voltage VBL3 supplied to a drain of the third memory cell MC3 and the third common source line voltage VCSL3 supplied to a source of the third memory cell MC3 is not enough to cause a hot hole. In other words, in the unselected cell string CS21, a program of the third memory cell MC3 is inhibited by preventing a boosting of a drain voltage of the third memory cell MC3.

Referring to FIGS. 2, 9 and 13, in the unselected cell string CS22, the third program voltage VPGM3 which is a negative voltage is applied to the selected third word line WL3. Thus, the third memory cell MC3 is turned off.

The fourth string select line voltages VSSL4 are applied to the unselected string select lines SSL2a and SSL2b. Thus, the string select transistors SSTa and SSTb are turned on. The third pass voltages VPASS3 are supplied to the fourth through sixth word lines WL4~WL6. Thus, the fourth through sixth memory cells MC4~MC6 are turned on.

The fourth bit line voltage VBL4 is supplied to the unselected second bit line BL2. The fourth bit line voltage VBL4 is supplied to channels of the fourth through sixth memory cells MC4~MC6 through the string select transistors SSTa and SSTb. The fourth string select line voltages VSSL4 are high voltages higher than the third string select line voltage VSSL3 and the fourth bit line voltage VBL4 is a low voltage lower than the third bit line voltage VBL3. Thus, when voltages of the channels of the fourth through sixth memory cells MC4~MC6 increase due to a coupling from their control gates, the string select transistors SSTa and SSTb are not turned off. Thus, the boosting described with reference to FIG. 10 does not occur and the voltages of the channels of the fourth through sixth memory cells MC4~MC6 become the fourth bit line voltage VBL4.

As the third pass voltages VPASS3 are supplied to the first and second word lines WL1 and WL2 and the third ground select line voltages VGSL3 are applied to the ground select lines GSLa and GSLb, the ground select transistors GSTa and GSTb and the first and second memory cells MC1 and MC2 are turned on. Thus, the third common source line voltage VCSL3 supplied to the common source line CSL is transmitted to a source of the selected third memory cell MC3 through the ground select transistors GSTa and GSTb and the first and second memory cells MC1 and MC2.

A voltage difference between the fourth bit line voltage VBL4 supplied to a drain of the third memory cell MC3 and the third common source line voltage VCSL3 supplied to a source of the third memory cell MC3 does not cause a hot hole. In other words, in the unselected cell string CS22, a program of the third memory cell MC3 is inhibited by preventing a boosting of a drain voltage of the third memory cell MC3.

FIG. 14 is a table illustrating voltages supplied to a memory block in the second program operation, according to an exemplary embodiment of the inventive concept. An example of voltages when the second program is performed in the ground select transistors GSTa and GSTb is illustrated in FIG. 14.

Referring to FIGS. 2 and 14, a fifth bit line voltage VBL5 is applied to a selected bit line. The fifth bit line voltage VBL5 may be a power supply voltage or a high voltage having a level similar to or higher than the power supply voltage. A sixth bit line voltage VBL6 is applied to an unselected bit line. The sixth bit line voltage VBL6 may be a ground voltage or a low voltage having a level similar to the ground voltage.

Fifth string select line voltages VSSL5 are applied to selected string select lines. The fifth string select line voltages VSSL5 may be voltages that turn on the string select transistors. The fifth string select line voltages VSSL5 may be a power supply voltage or high voltages having a level similar to or higher than the power supply voltage. The fifth string select line voltages VSSL5 may have substantially the same level as the fifth bit line voltage VBL5. Sixth string select line voltages VSSL6 are applied to an unselected string select line. The sixth string select line voltages VSSL6 may be voltages that turn on the string select transistors. The sixth string select line voltages VSSL6 may be a power supply voltage or high voltages having a level higher than the fifth string select line voltages VSSL5. The sixth string select line voltages VSSL6 may be high voltages that prevent boosting.

Fourth pass voltages VPASS4 are applied to the word lines WL1~WL6. The fourth pass voltages VPASS4 may be voltages that turn on the first through sixth memory cells MC1~MC6. The fourth pass voltages VPASS4 may be a power supply voltage or high voltages higher than the fifth string select line voltages VSSL5.

The fourth program voltage VPGM4 is applied to the selected ground select line. The fourth program voltage VPGM4 may be a negative voltage.

The fourth ground select line voltage VGSL4 is applied to the unselected ground select line. The fourth ground select line voltage VGSL4 may be a voltage that turns on the ground select transistors. The fourth ground select line voltage VGSL4 may be a power supply voltage or a high voltage having a level similar to or higher than the power supply voltage.

The common source line voltage VCSL4 is applied to the common source line CSL. The common source line voltage VCSL4 may be a ground voltage or a low voltage having a level similar to the ground voltage.

As described with reference to FIG. 7, the first program operation is performed in the ground select transistor GSTa connected to the ground select line GSLa. In addition, among the ground select transistors GSTa, threshold voltages of the ground select transistors GSTa that belong to the cell string CS11 are higher than the verify voltage VFYu and threshold voltages of the ground select transistors GSTa that belong to the remaining cell strings CS12, CS21 and CS22 are lower than the verify voltage VFYu. In other words, the string select lines SSL1a and SSL1b and the bit line BL1 that correspond to the cell string CS11 are selected and the string select lines SSL2a and SSL2b and the bit line BL2 that do not correspond to the cell string CS11 are unselected.

Figure 15:
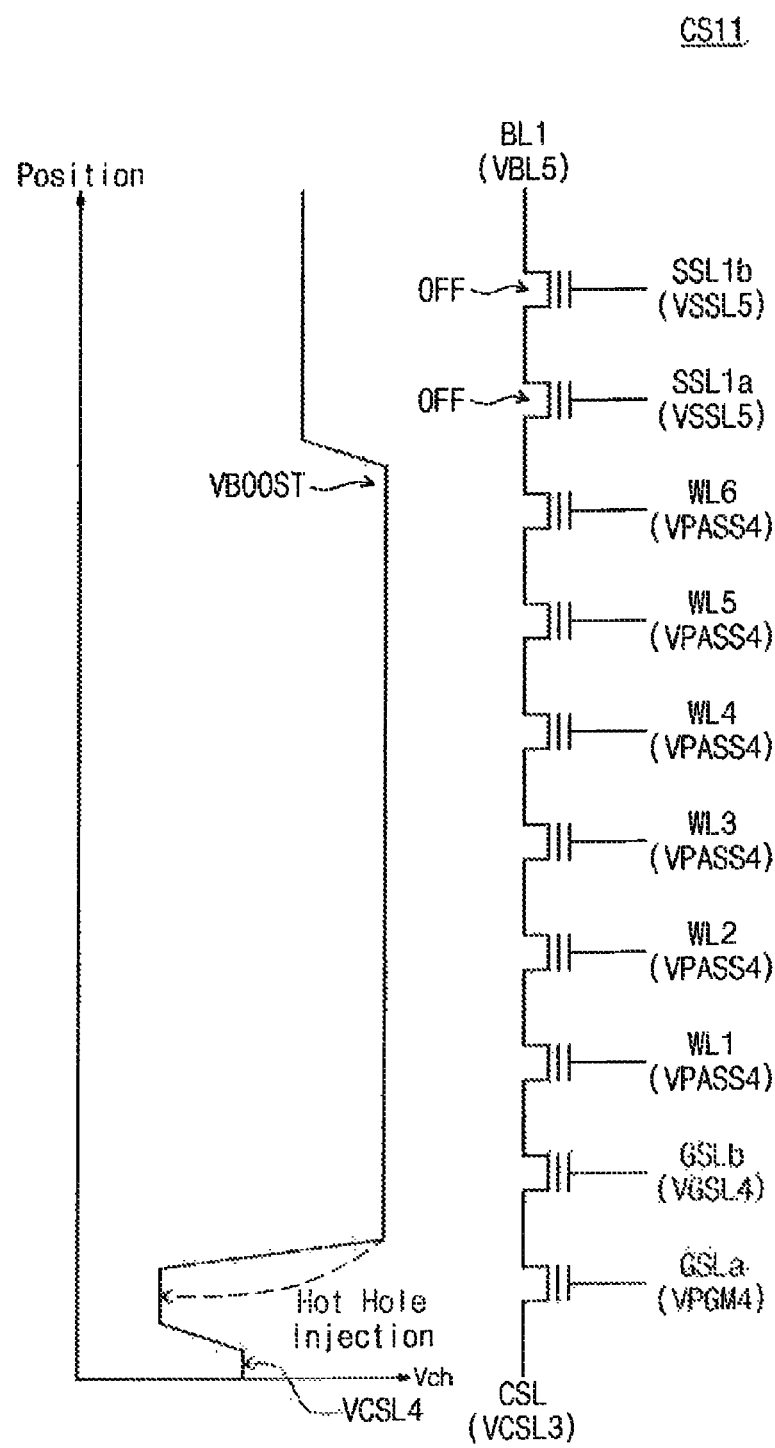
FIG. 15 illustrates voltages applied to a cell string selected in the second program operation, according to an exemplary embodiment of the inventive concept.

FIG. 15 illustrates voltages applied to a cell string selected in the second program operation, according to an exemplary embodiment of the inventive concept. In FIG. 15, the cell string CS11 is illustrated in a right side and a voltage (or potential) graph of channels of the cell transistors of the cell string CS11 is illustrated in a left side. In the voltage (or potential) graph, a horizontal axis indicates voltages of the channels Vch and a vertical axis indicates a location (Position) of the cell transistors.

Referring to FIGS. 2, 14 and 15, the fourth program voltage VPGM4 which is a negative voltage is applied to the selected ground select line GSLa. Thus, the ground select transistor GSTa is turned off. For example, a channel of the ground select transistor GSTa has a first type (for example, a p-type). Due to a coupling between a control gate and the channel of the ground select transistor GSTa, a voltage of the channel of the ground select transistor GSTa may decrease.

The fifth string select line voltages VSSL5 are applied to the selected string select lines SSL1a and SSL1b. In an initial state when the fifth string select line voltages VSSL5 are applied, the string select transistors SST1a and SST1b may be turned on.

The fifth bit line voltage VBL5 is supplied to the selected first bit line BL1. The fifth bit line voltage VBL5 may be transmitted to the memory cell MC6 through channels of the string select transistors SST1a and SST1b that are turned on.

If the fourth pass voltages VPASS4 are applied to the first through sixth word lines WL1~WL6, the first through sixth memory cells MC1~MC6 are turned on. For example, channels of the first through sixth memory cells MC1~MC6 have a second type (for example, an n-type). If the fourth ground select line voltage VGSL4 is applied to the ground select line GSLb, the ground select transistor GSTb is turned on. For example, a channel of the ground select transistor GSTb has the second type. Since the ground select transistor GSTa is turned off, a voltage transmitted from the selected bit line BL1 to a drain of the sixth memory cell MC6 is transmitted to the first through sixth memory cells MC1~MC6 and a channel of the ground select transistor GSTb.

After the first through sixth memory cells MC1~MC6 and the ground select transistor GSTb are turned on, as voltages of control gates of the first through sixth memory cells MC1~MC6 rise to target levels of the fourth pass voltages VPASS4 and a voltage of a control gate of the ground select line GSLb rises to a target level of the fourth ground select line voltage VGSL4, a coupling occurs between control gates and channels of the first through sixth memory cells MC1~MC6 and the ground select transistor GSTb. Due to the coupling, voltages of the channels of the first through sixth memory cells MC1~MC6 and the ground select transistor GSTb may be higher than a voltage supplied from the first bit line VBL1 to a drain of the sixth memory cell MC6. At this time, the string select transistors SST1a and SST1b are turned off. In other words, channels of the first through sixth memory cells MC1~MC6 and the ground select transistor GSTb are isolated from the first bit line BL1 and floated between the ground select transistor GSTa and the string select transistors SST1a and SST1b that are turned off.

The fifth string select line voltages VSSL5 and the fifth bit line voltage VBL5 may have substantially the same levels. A voltage transmitted to a drain of the memory cell MC6 may have a level obtained by subtracting threshold voltages of the string select transistors SST1a and SST1b from the fifth string select line voltages VSSL5 or the fifth bit line voltage VBL5. In this case, if a drain voltage of the memory cell MC6 increases due to a coupling, a turn-on condition of the string select transistors SST1a and SST1b is not satisfied and thereby the string select transistors SST1a and SST1b are turned off.

After the string select transistors SST1a and SST1b are turned off, voltages of channels of the first through sixth memory cells MC1~MC6 and the ground select transistor GSTb further increase due to the coupling effect. In other words, the channels of the first through sixth memory cells MC1~MC6 and the ground select transistor GSTb are floated and voltages of the floated channels are boosted. For example, the voltages of channels of the first through sixth memory cells MC1~MC6 and the ground select transistor GSTb may rise to a boost voltage VBOOST. In other words, the boost voltage VBOOST is supplied to a drain of the selected ground select transistor GSTa.

The fourth common source line voltage VCSL4 supplied to the common source line CSL is transmitted to a source of the selected ground select transistor GSTa.

Due to a voltage difference between the boost voltage VBOOST supplied to the drain of the ground select transistor GSTa and the fourth common source line voltage VCSL4 supplied to the source of the ground select transistor GSTa, a hot hole appears around/in the ground select transistor GSTa. Due to the fourth program voltage VPGM4 which is a negative voltage applied to a control gate of the ground select transistor GSTa, a hot hole is injected into the ground select transistor GSTa. In other words, a threshold voltage of the ground select transistor GSTa is reduced.

In the unselected cell strings CS12, CS21 and CS22, as described with reference to FIGS. 11 through 13, a program of the ground select transistor GSTa may be inhibited by preventing voltages of drains of the ground select transistor GSTa from being boosted.

The ground select transistor GSTb is programmed in a similar manner. For example, in a selected cell string, a drain voltage of the ground select transistor GSTb is boosted. A low voltage supplied to the common source line CSL is transmitted to a source of the ground select transistor GSTb. If a negative voltage is supplied to the ground select transistor GSTb, a threshold voltage of the ground select transistor GSTb of the selected cell string is reduced.

In unselected cell strings, voltages of drains of the ground select transistor GSTb are prevented from being boosted. A low voltage supplied to the common source line CSL is transmitted to sources of the ground select transistor GSTb. When a negative voltage is supplied to the ground select line GSLb, threshold voltages of the ground select transistor GSTb of the unselected cell strings are not reduced.

While the verify step and the program step of FIG. 8 are repeatedly performed, a level of the fourth program voltage VPGM4 may gradually increase or decrease. While the verify step and the program step of FIG. 8 are repeatedly performed, levels of the fourth pass voltages VPASS4 are gradually increased or decreased and thereby a level of the boost voltage VBOOST may gradually increase or decrease.

Figure 16:
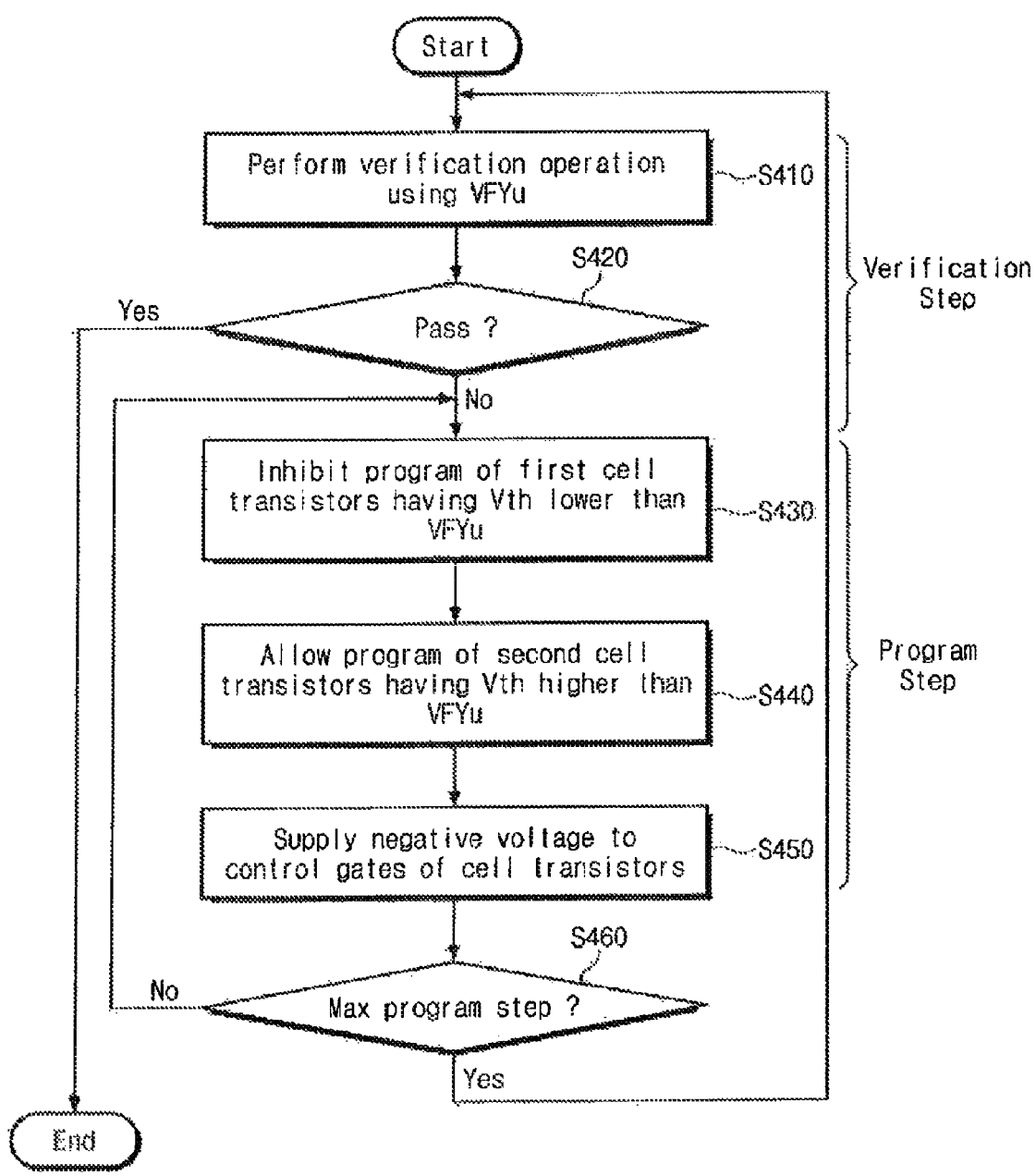
FIG. 16 is a flowchart illustrating a second program operation, according to an exemplary embodiment of the inventive concept.

FIG. 16 is a flowchart illustrating a second program operation, according to an exemplary embodiment of the inventive concept. Referring to FIGS. 1 through 3 and 16, in step S410, a verify operation is performed using the verify voltage VFYu. If the verify operation is performed, among cell transistors on which the first program operation is performed, first cell transistors having threshold voltages lower than the verify voltage VFYu and second cell transistors having threshold voltages higher than the verify voltage VFYu are distinguished from each other.

In step S420, it is determined whether the verify operation has passed or not. If the verify operation is determined to have passed, the second program operation may be finished. If the result of the verify operation is not determined to have passed, step S430 is performed. The steps S410 and S420 may be a verification step.

In the step S430, a program of the first cell transistors having threshold voltages lower than the verify voltage VFYu is inhibited. In step S440, a program of the second transistors having threshold voltages higher than the verify voltage VFYu is allowed. After that, in step S450, a negative voltage is supplied to control gates of the first and second cell transistors.

In step S460, it is determined whether a max program step is performed. For example, it may be determined whether a program step including the steps S430 through S450 is performed as many as a predetermined number of times.

As described with reference to FIGS. 10 through 15, in the second program operation, a threshold voltage of a selected cell transistor of a selected cell string is reduced by boosting a drain voltage of the selected cell transistor of the selected cell string. The boosted voltage may be gradually reduced due to a peripheral effect such as a leakage. If the boosted voltage is gradually reduced, a program efficiency of the selected cell transistor may be degraded. To prevent program efficiency from being degraded due to reduction of the boosted voltage, the program step including the steps S430 through S450 may be performed several times.

For example, after a kth program step is performed, a selected cell string may be restored. For example, channel voltages of cell transistors of the cell strings of the memory block BLKa may be discharged. Then, after a verification step, the voltages described with reference to FIG. 9 or 14 are applied again and thereby a k+1th program step may be performed.

While a program step is repeatedly performed, voltage conditions may be controlled. For example, a level of a negative voltage applied to a control gate of the selected cell transistor may increase or decrease. Levels of the pass voltages VPASS applied to unselected word lines increase or decrease and thereby a level of the boost voltage VBOOST may increase or decrease. A level of a low voltage applied to the common source line CSL may increase or decrease.

Figure 17:
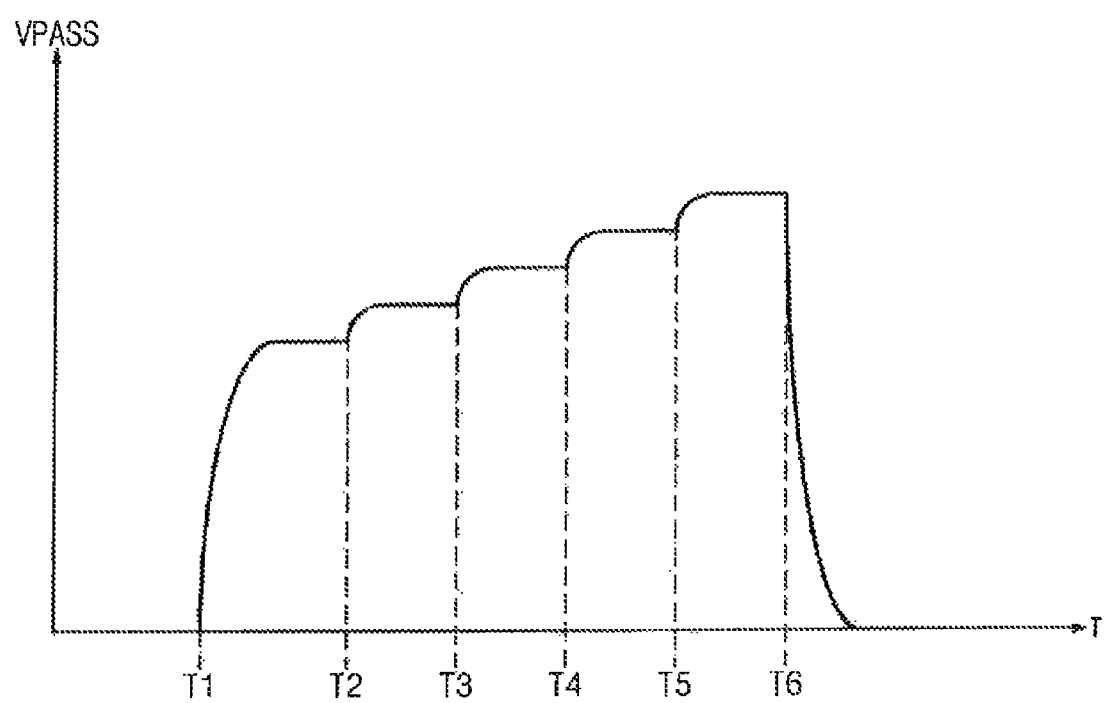
FIG. 17 is a timing diagram illustrating control of a level of a pass voltage in a second program operation, according to an exemplary embodiment of the inventive concept.

FIG. 17 is a timing diagram illustrating control of a level of a pass voltage in a second program operation, according to an exemplary embodiment of the inventive concept. In FIG. 17, a horizontal axis indicates time T and a vertical axis indicates a level of a pass voltage VPASS. An example of controlling a level of the pass voltage VPASS in the program step of FIG. 16 is illustrated in FIG. 17.

Referring to FIG. 17, the pass voltage VPASS is applied to word lines WL at a first time T1. After that, a level of the pass voltage VPASS increases at a second time T2, a third time T3, a fourth time T4 and a fifth time T5. After that, at a sixth time T6, the pass voltage VPASS is discharged.

As described with reference to FIG. 16, a level of the boosted voltage VBOOST may be gradually reduced as time goes by. As illustrated in FIG. 17, if a level of the pass voltage VPASS gradually increases, due to a coupling, a level of the boosted voltage VBOOST gradually rises. In other words, a reduction and a rise of the boosted voltage VBOOST cancel each other and thereby a level of the boosted voltage VBOOST is maintained while the program step of the second program operation is performed.

As described with reference to FIG. 16, the program step of the second program operation is repeatedly performed but a level of the pass voltage VPASS in each program step may be controlled as described with reference to FIG. 17.

Figure 18:
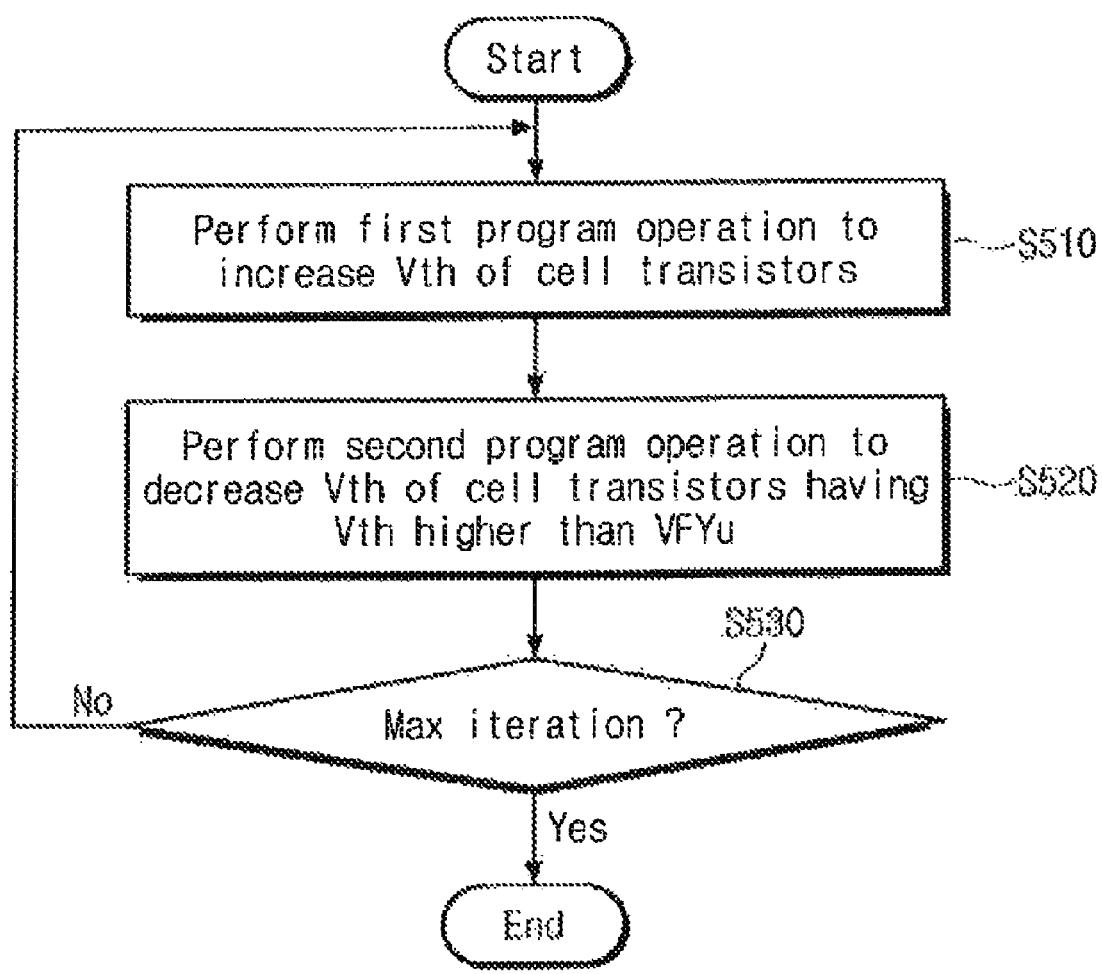
FIG. 18 is a flowchart illustrating an operating method of a nonvolatile memory in accordance with an exemplary embodiment of the inventive concept.

FIG. 18 is a flowchart illustrating an operating method of a nonvolatile memory in accordance with an exemplary embodiment of the inventive concept. Referring to FIGS. 1, 2 and 18, in step S510, the first program operation is performed to increase threshold voltages of the cell transistors. For example, threshold voltages of the cell transistors selected as a program target may increase.

In step S520, the second program operation is performed to decrease threshold voltages of the cell transistors having a threshold voltage higher than the verify voltage VFYu among the cell transistors. For example, among the cell transistors on which the first program operation is performed, threshold voltages of the cell transistors having a threshold voltage higher than the verify voltage VFYu may be reduced through the second program operation. For example, the verify voltage VFYu may be an upper limit of a target threshold voltage range of the cell transistors.

In step S530, it is determined a maximum number of iterations has been reached. For example, it is determined whether the first and second program operations have been performed a predetermined number of times. If the first and second program operations have not been performed the predetermined number of times, the steps S510 and S520 are repeated, and thus, the first program operation and the second program operation are performed again. If the first and second program operations have been performed the predetermined number of times, a program of the cell transistors is finished.

If an operation of increasing threshold voltages of the cell transistors through the first program operation and an operation of decreasing threshold voltages of the cell transistors having a threshold voltage higher than the verify voltage VFYu through the second program operation are repeatedly performed, a threshold voltage distribution of the cell transistors may be reduced.

While the first program operation is repeatedly performed, voltages applied to the cell strings CS11, CS12, CS21 and CS22 may be changed. For example, a level of the program voltage VPGM may gradually increase.

When the second program operation begins, voltages applied to the cell strings CS11, CS12, CS21 and CS22 may be initialized as initial values.

Figure 19:
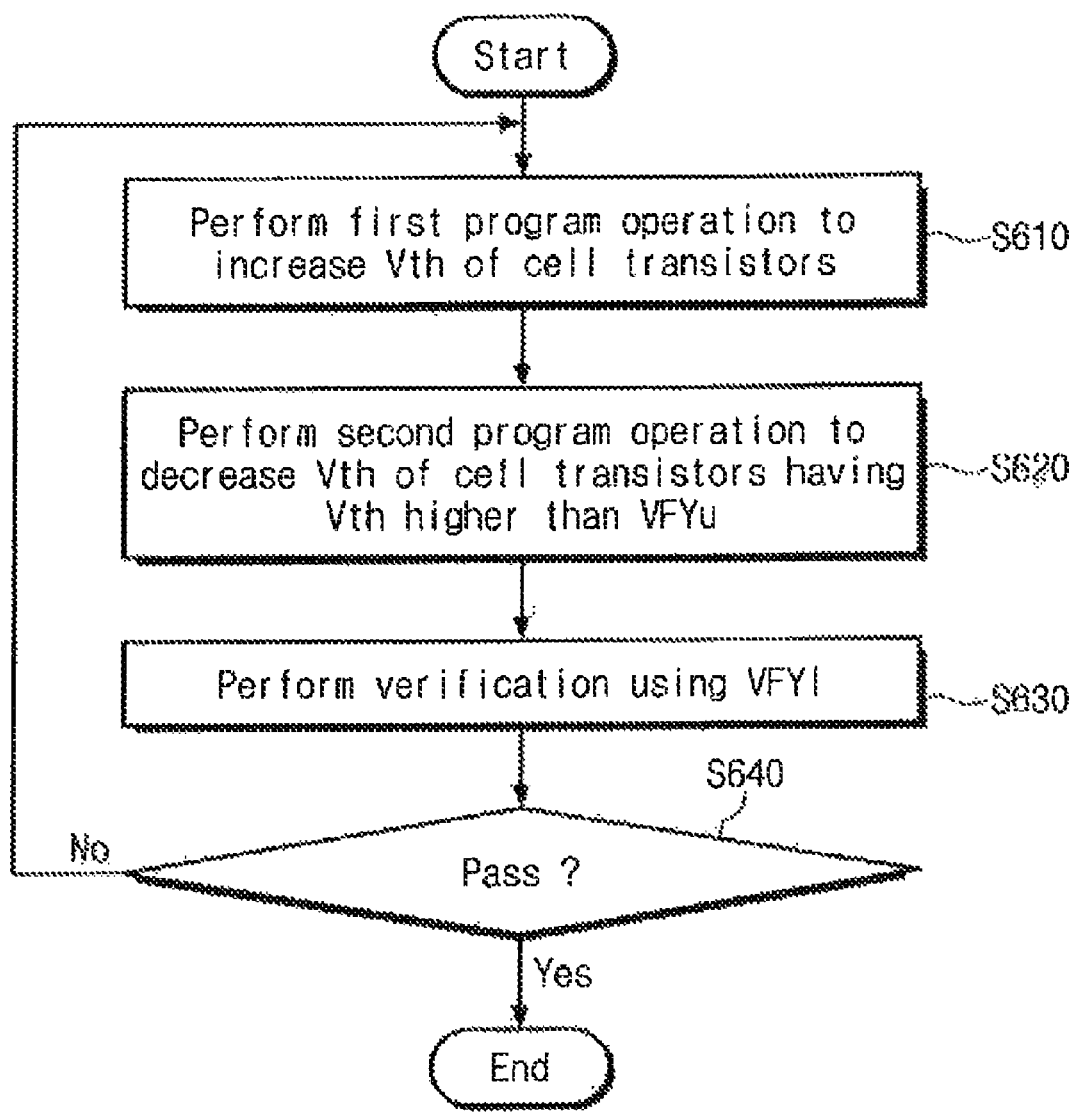
FIG. 19 is a flowchart illustrating an operating method of a nonvolatile memory in accordance with an exemplary embodiment of the inventive concept.

FIG. 19 is a flowchart illustrating an operating method of the nonvolatile memory 110 in accordance with an exemplary embodiment of the inventive concept. Referring to FIGS. 1, 2 and 19, in step S610, the first program operation is performed to increase threshold voltages of the cell transistors. For example, all of the threshold voltages of cell transistors selected as a program target may increase.

In step S620, the second program operation is performed to decrease threshold voltages of the cell transistors having a threshold voltage higher than the verify voltage VFYu among the cell transistors. For example, among the cell transistors on which the first program operation is performed, threshold voltages of the cell transistors having a threshold voltage higher than the verify voltage VFYu may be reduced through the second program operation. For example, the verify voltage VFYu may be an upper limit of a target threshold voltage range of the cell transistors.

In step S630, a verify operation is performed on the cell transistors using the verify voltage VFY1. For example, if among the cell transistors, a cell transistor having threshold voltages lower than the verify voltage VFY1 exists, or the number of cell transistors having threshold voltages lower than the verify voltage VFY1 is greater than a predetermined value, the verify operation may be determined to have failed. If among the cell transistors, a cell transistor having threshold voltages lower than the verify voltage VFY1 does not exist, or the number of cell transistors having threshold voltages lower than the verify voltage VFY1 is not greater than the predetermined value, a result of the verify operation may be determined to have passed.

In step S640, if the verify operation is determined to have passed, a program of the cell transistors is finished. If the verify operation is determined to have failed, the steps S610 through S630 are performed again.

If the number of times the steps S610 through S630 are repeatedly performed reaches a predetermined threshold, it may be determined that a program of the cell transistors is finished and an error occurs.

While the first program operation is repeatedly performed, voltages applied to the cell strings CS11, CS12, CS21 and CS22 may be changed. For example, a level of the program voltage VPGM may gradually increase.

When the second program operation begins, voltages applied to the cell strings CS11, CS12, CS21 and CS22 may be initialized as initial values.

Figure 20:
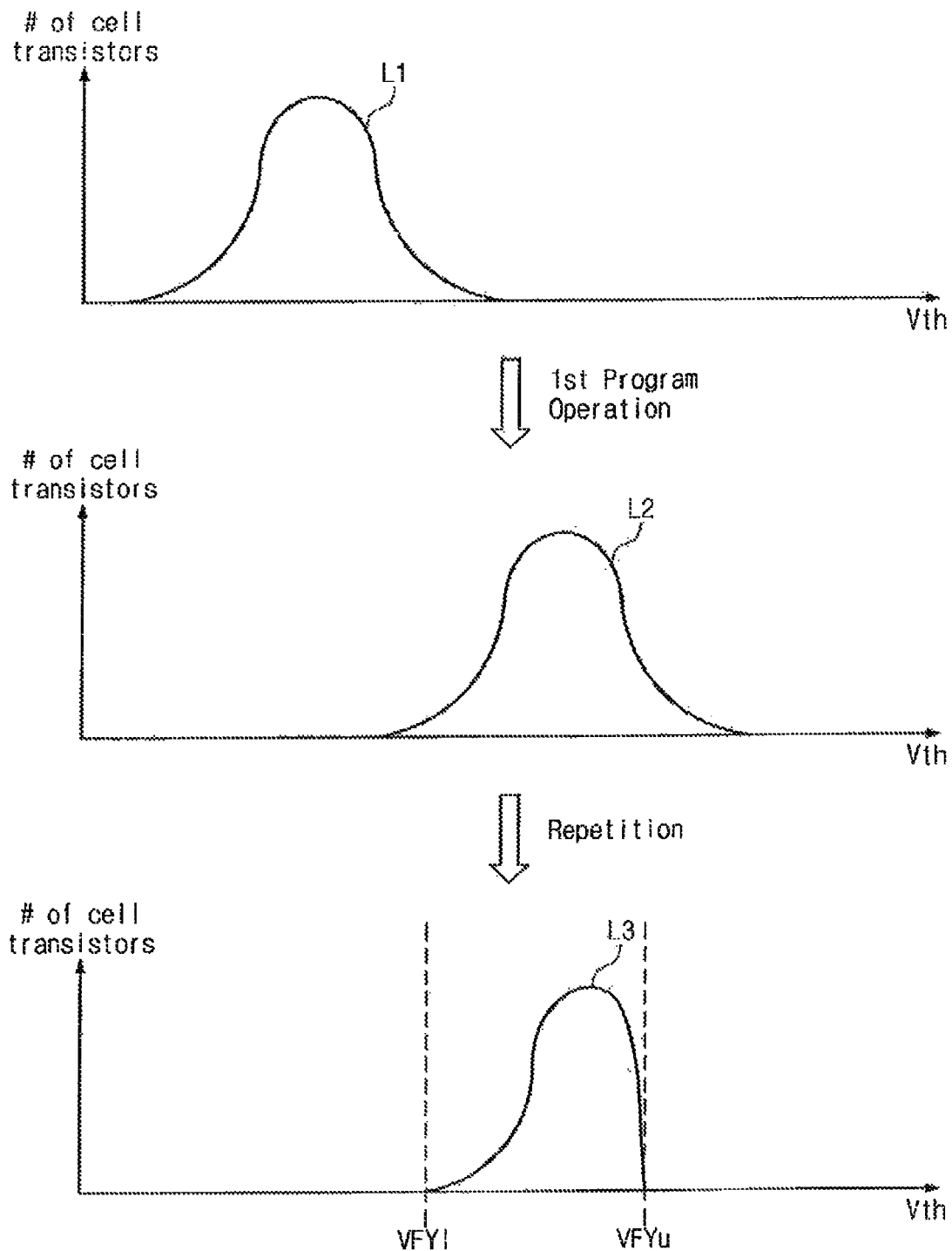
FIG. 20 illustrates changes of threshold voltages of cell transistors in the operating method of FIG. 19, according to an exemplary embodiment of the inventive concept.

FIG. 20 illustrates changes of threshold voltages of cell transistors in the operating method of FIG. 19, according to an exemplary embodiment of the inventive concept. In FIG. 20, a horizontal axis indicates threshold voltages Vth of the cell transistors and a vertical axis indicates the number of cell transistors. In other words, FIG. 20 shows a threshold voltage distribution of the cell transistors.

Referring to FIGS. 1, 2, 19 and 20, an initial threshold voltage distribution of the cell transistors may be indicated by a first line L1.

If the first program operation of the step S610 is performed, threshold voltages of the cell transistors increase. For example, a threshold voltage distribution of the cell transistors may be changed from the first line L1 to a second line L2.

If the second program operation of the step S620 is performed, threshold voltages of cell transistors having threshold voltages higher than the verify voltage VFYu are reduced. For example, the threshold voltages higher than the verify voltage VFYu may become lower than the verify voltage VFYu. The first and second program operations are performed until threshold voltages of the cell transistors are equal to or higher than the verify voltage VFY1. In other words, a threshold voltage distribution of the cell transistors may be changed from the second line L2 to a third line L3.

As described above, if the first and second program operations are performed, a threshold voltage distribution of the cell transistors is reduced and, in particular, threshold voltages of the cell transistors are limited to a range between the verify voltage VFYu and the verify voltage VFY1. Since the threshold voltages of the cell transistors are controlled within a target range, reliability of the nonvolatile memory 110 including the cell transistors is increased.

Figure 21:
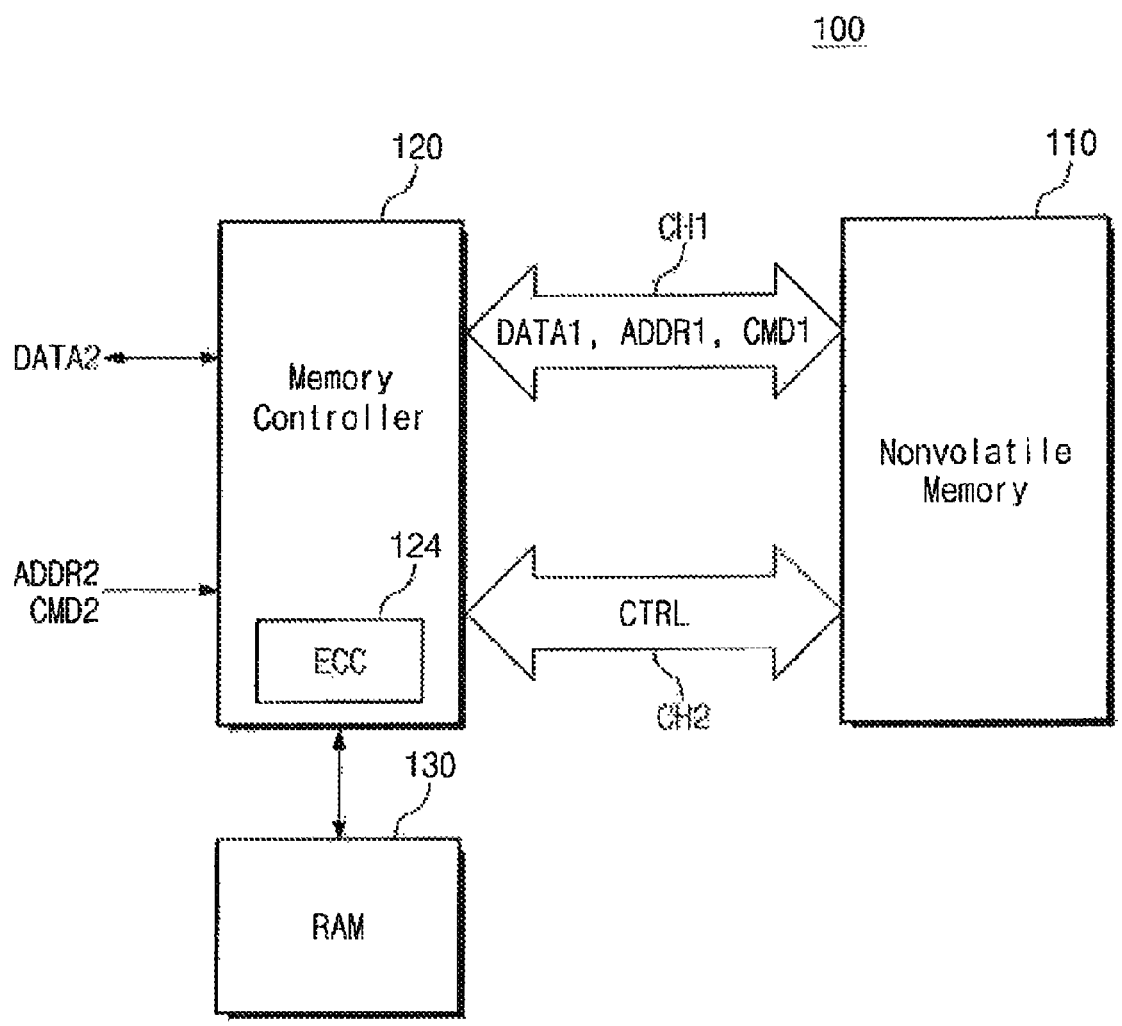
FIG. 21 is a block diagram illustrating a storage device in accordance with an exemplary embodiment of the inventive concept.

FIG. 21 is a block diagram illustrating a storage device in accordance with an exemplary embodiment of the inventive concept. Referring to FIG. 21, a storage device 100 includes a nonvolatile memory 110, a memory controller 120 and a random access memory (RAM) 130.

The nonvolatile memory 110 can perform write, read and erase operations under the control of the memory controller 120. The nonvolatile memory 110 can exchange first data DATA1 with the memory controller 120. For example, the nonvolatile memory 110 can receive the first data DATA1 from the memory controller 120 and write the first data DATA1. The nonvolatile memory 110 can perform a read operation and output the read first data DATA1 to the memory controller 120.

The nonvolatile memory 110 can receive a first command CMD1 and a first address ADDR1 from the memory controller 120. The nonvolatile memory 110 can exchange a control signal CTRL with the memory controller 120. For example, the nonvolatile memory 110 can receive at least one of a chip select signal /CE selecting at least one semiconductor chip among a plurality of semiconductor chips constituting the nonvolatile memory 110, a command latch enable signal CLE indicating that a signal received from the memory controller 120 is the first command CMD1, an address latch enable signal ALE indicating that a signal received from the memory controller 120 is the first address ADDR1, a read enable signal /RE which is generated by the memory controller 120 in a read operation and periodically toggled to be used to adjust timing, a write enable signal /WE activated by the memory controller 120 when the first command CMD1 or the first address ADDR1 is transmitted, a write preventing signal /WP activated by the memory controller 120 to prevent an unwanted erase or an unwanted write when power supply is changed, and a data strobe signal DQS which is generated by the memory controller 120 in a write operation and is periodically toggled to be used to adjust an input sync of the first data DATA1 from the memory controller 120. For example, the nonvolatile memory 110 can output at least one of a ready & busy signal R/nB indicating whether the nonvolatile memory 110 performs a program, erase or read operation, and a data strobe signal DQS which is generated from the read enable signal /RE by the nonvolatile memory 110 and is periodically toggled to be used to adjust an output sync of the first data DATA1 to the memory controller 120.

The first data DATA1, the first address ADDR1 and the first command CMD1 can be communicated with the memory controller 120 through a first channel CH1. The first channel CH1 may be an input/output channel. The control signal CTRL can be communicated with the memory controller 120 through a second channel CH2. The second channel CH2 may be a control channel.

The nonvolatile memory 110 has the structures described with reference to FIGS. 1 through 20 and may operate according to the methods described with reference to FIGS. 1 through 20. For example, the nonvolatile memory 110 can perform the first program operation of increasing threshold voltages of the cell transistors and the second program operation of reducing threshold voltages of cell transistors having threshold voltages higher than the verify voltage among the programmed cell transistors.

The nonvolatile memory 110 may include a flash memory. However, the nonvolatile memory 110 is not limited to include a flash memory. The nonvolatile memory 110 may include at least one of various nonvolatile memories such as a phase-change RAM (PRAM), a magnetic RAM (MRAM), a resistive RAM (RRAM), a ferroelectric RAM (FeRAM), etc.

The memory controller 120 is configured to control the nonvolatile memory 110. For example, the memory controller 120 can control the nonvolatile memory 110 to perform a write, read or erase operation. The memory controller 120 can exchange the first data DATA1 and the control signal CTRL with the nonvolatile memory 110 and output the first command CMD1 and the first address ADDR1 to the nonvolatile memory 110.

The memory controller 120 can control the nonvolatile memory 110 under the control of an external host device. The memory controller 120 can exchange second data DATA2 with the external host device and receive a second command CMD2 and a second address ADDR2 from the external host device.

The memory controller 120 can exchange the first data DATA1 with the nonvolatile memory 110 by a first unit (for example, a time unit or a data unit) and exchange the second data DATA2 with the external host device by a second unit (for example, a time unit or a data unit) different from the first unit.

The memory controller 120 can exchange the first data DATA1 with the nonvolatile memory 110 according to a first format and transmit the first command CMD1 and the first address ADDR1 to the nonvolatile memory 110. The memory controller 120 can exchange the second data DATA2 with the external host device according to a second format different from the first format and receive the second command CMD2 and the second address ADDR2 from the external host device.

The memory controller 120 can use the RAM 130 as a buffer memory, a cache memory or an operation memory. For example, the memory controller 120 can receive the second data DATA2 from the external host device, store the received second data DATA2 in the RAM 130 and write the second data DATA2 stored in the RAM 130 in the nonvolatile memory 110 as the first data DATA1. The memory controller 120 can read the first data DATA1 from the nonvolatile memory 110, store the read first data DATA1 in the RAM 130 and output the first data DATA1 stored in the RAM 130 to the external host device as the second data DATA2. The memory controller 120 can store data read from the nonvolatile memory 110 in the RAM 130 and write data stored in the RAM 130 in the nonvolatile memory 110 again.

The memory controller 120 can store data or a code used to manage the nonvolatile memory 110 in the RAM 130. For example, the memory controller 120 can read data or a code for managing the nonvolatile memory 110 from the nonvolatile memory 110 and load it into the RAM 130 to drive the nonvolatile memory 110.

The memory controller 120 may include an error correction code (ECC) block 124. The ECC block 124 can generate a parity based on the first data DATA1 written in the nonvolatile memory 110. The generated parity can be written in the nonvolatile memory 110 together with the first data DATA1. An operation of generating the parity may be an error correction encoding operation. The ECC block 124 can receive the first data DATA1 and the parity from the nonvolatile memory 110. The ECC block 124 can correct an error of the first data DATA1 using the received parity. An operation of correcting an error may be an error correction decoding operation.

In an error correction decoding operation, the ECC block 124 can perform a simplified error correction or a complete error correction. The simplified error correction may be an error correction having a reduced error correction time. The complete error correction may be an error correction having more reliability. The ECC block 124 can increase an operation speed and reliability of the storage device 100 by selectively performing the simplified error correction or the complete error correction.

The RAM 130 may include at least one of various random access memories such as a dynamic RAM (DRAM), a static RAM (SRAM), a synchronous DRAM (SDRAM), a PRAM, an MRAM, an RRAM, an FeRAM, etc.

To reduce an overhead that an erase operation creates in the nonvolatile memory 110, the storage device 100 may perform an address mapping. For example, when an overwrite operation is requested from the external host device, the storage device 100 may store the overwrite-requested data in memory cells of a free storage space instead of erasing memory cells storing existing data to store the overwrite-requested data in the erased memory cells. The memory controller 120 can drive a flash translation layer (FTL) mapping a logical address used in the external host device and a physical address used in the nonvolatile memory 110 according to the method described above. For example, the second address ADDR2 may be a logical address and the first address ADDR1 may be a physical address.

The storage device 100 can perform a write, read or erase operation of data according to a request of the external host device. The storage device 100 may include a solid state drive (SSD) or a hard disk drive (HDD). The storage device 100 may include memory cards such as a personal computer memory card international association (PCMCIA) card, a compact flash (CF) card, a smart media card (SM, SMC), a memory stick, a multimedia card (MMC, reduced size (RS)-MMC, MMCmicro), a secure digital (SD) card (SD, miniSD, microSD, secure digital high capacity (SDHC)), a universal flash memory device (UFS), etc. The storage device 100 may include a mounted memory such as an embedded multimedia card (eMMC), a UFS, a perfect page new (PPN), etc.

Figure 22:
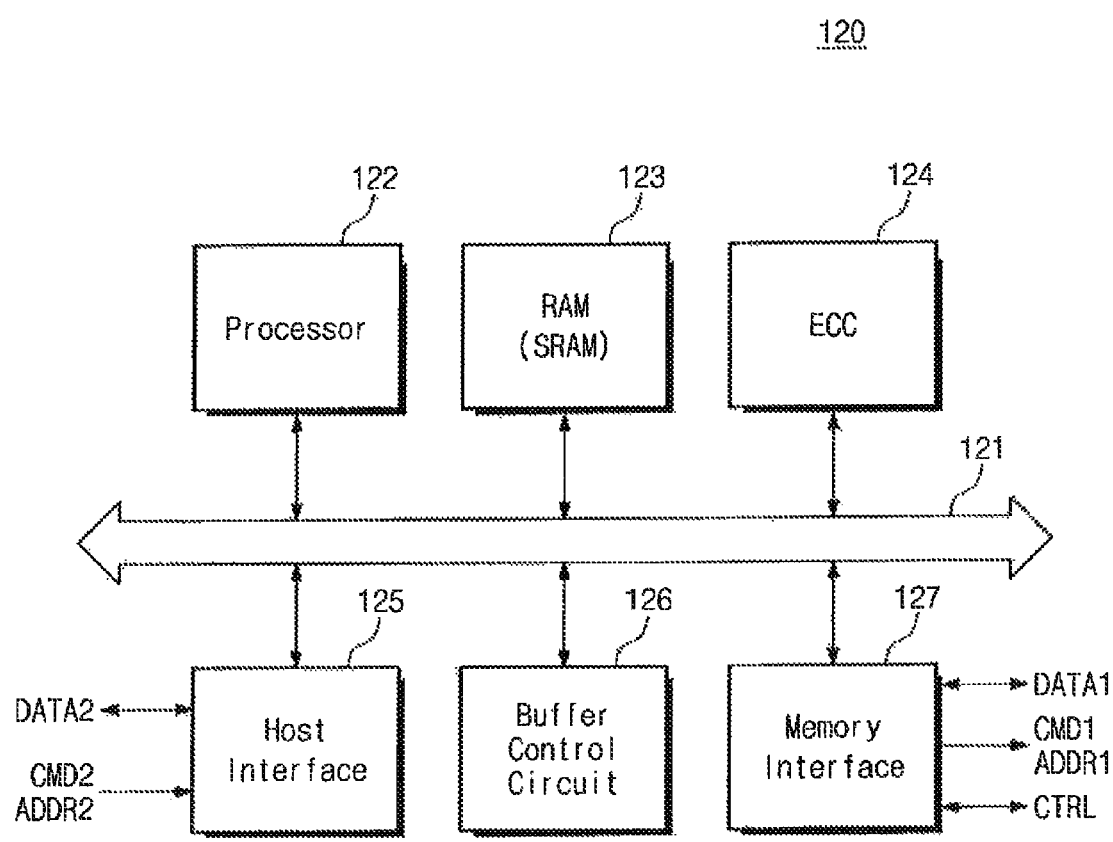
FIG. 22 is a block diagram illustrating a memory controller in accordance with an exemplary embodiment of the inventive concept.

FIG. 22 is a block diagram illustrating a memory controller in accordance with an exemplary embodiment of the inventive concept. Referring to FIG. 22, the memory controller 120 includes a bus 121, a processor 122, a RAM 123, an ECC block 124, a host interface 125, a buffer control circuit 126 and a memory interface 127.

The bus 121 is configured to provide a channel among constituent elements of the memory controller 120.

The processor 122 can control an overall operation of the memory controller 120 and perform a logical operation. The processor 122 can communicate with an external host device through the host interface 125. The processor 122 can store the second command CMD2 and the second address ADDR2 received through the host interface 125 in the RAM 123. The processor 122 can generate the first command CMD1 and the first address ADDR1 according to the second command CMD2 and the second address ADDR2 stored in the RAM 123 and output the generated first command CMD1 and the first address ADDR1 through the memory interface 127.

The processor 122 can output the second data DATA2 received through the host interface 125 through the buffer control circuit 126 or store the second data DATA2 in the RAM 123. The processor 122 can output data stored in the RAM 123 or data received through the buffer control circuit 126 through the memory interface 127 as the first data DATA1. The processor 122 can store the first data DATA1 received through the memory interface 127 in the RAM 123 or output the first data DATA1 through the buffer control circuit 126. The processor 122 can output data stored in the RAM 123 or data received through the buffer control circuit 126 through the host interface 125 as the second data DATA2 or through the memory interface 127 as the first data DATA1.

The RAM 123 may be used as an operation memory, a cache memory or a buffer memory of the processor 122. The RAM 123 can store codes and commands executed by the processor 122. The RAM 123 can store data processed by the processor 122. The RAM 123 may include an SRAM.

The ECC block 124 can perform an error correction operation. The ECC block 124 can generate an error correction code (for example, parity) for performing an error correction on the basis of the first data DATA1 to be output to the memory interface 127 or the second data DATA2 received from the host interface 125. The first data DATA1 and the parity can be output through the memory interface 127. The ECC block 124 can perform an error correction of the received first data DATA1 using the first data DATA1 and the parity received through the memory interface 127. The ECC block 124 may be included in the memory interface 127 as a constituent element of the memory interface 127.

The host interface 125 is configured to communicate with an external host device under the control of the processor 122. The host interface 125 can receive the second command CMD2 and the second address ADDR2 from the external host device and exchange the second data DATA2 with the external host device.

The host interface 125 may be configured to perform a communication using at least one of many different communication methods such as a universal serial bus (USB), a serial advanced technology attachment (SATA), a serial attachment small computer system interface (SAS), a high speed interchip (HSIC), a small computer system interface (SCSI), a Firewire, a peripheral component interconnection (PCI), a PCI express (PCIe), a nonvolatile memory express (NVMe), a UFS, an SD, an MMC, an eMMC, etc.

The buffer controller circuit 125 is configured to control the RAM 130 (refer to FIG. 21) under the control of the processor 122. The buffer control circuit 126 can write data in the RAM 130 and read data from the RAM 130.

The memory interface 127 is configured to communicate with the nonvolatile memory 110 (refer to FIG. 1) under the control of the processor 122. The memory interface 127 can transmit the first command CMD1 and the first address ADDR1 to the nonvolatile memory 110 and exchange the first data DATA1 and the control signal CTRL with the nonvolatile memory 110.

The RAM 130 may not be provided to the storage device 100. In other words, the storage device 100 may not have a separate memory outside the memory controller 120 and the nonvolatile memory 110. In this case, the buffer control circuit 126 may not be provided to the memory controller 120. A function of the RAM 130 may be performed by the internal RAM 123 of the memory controller 120.

As an example, the processor 122 can control the memory controller 120 using codes. The processor 122 can load codes from nonvolatile memory (for example, read only memory) provided inside the memory controller 120. As another example, the processor 122 can load codes received from the memory interface 127.

The bus 121 of the memory controller 120 may be divided into a control bus and a data bus. The data bus may be configured to transmit data in the memory controller 120 and the control bus may be configured to transmit control information such as a command, an address, etc. in the memory controller 120. The data bus and the control bus may be separated from each other and may not interfere or affect each other. The data bus may be connected to the host interface 125, the buffer control circuit 126, the ECC block 124 and the memory interface 127. The control bus may be connected to the host interface 125, the processor 122, the buffer control circuit 126, RAM 123 and the memory interface 127.

Figure 23:
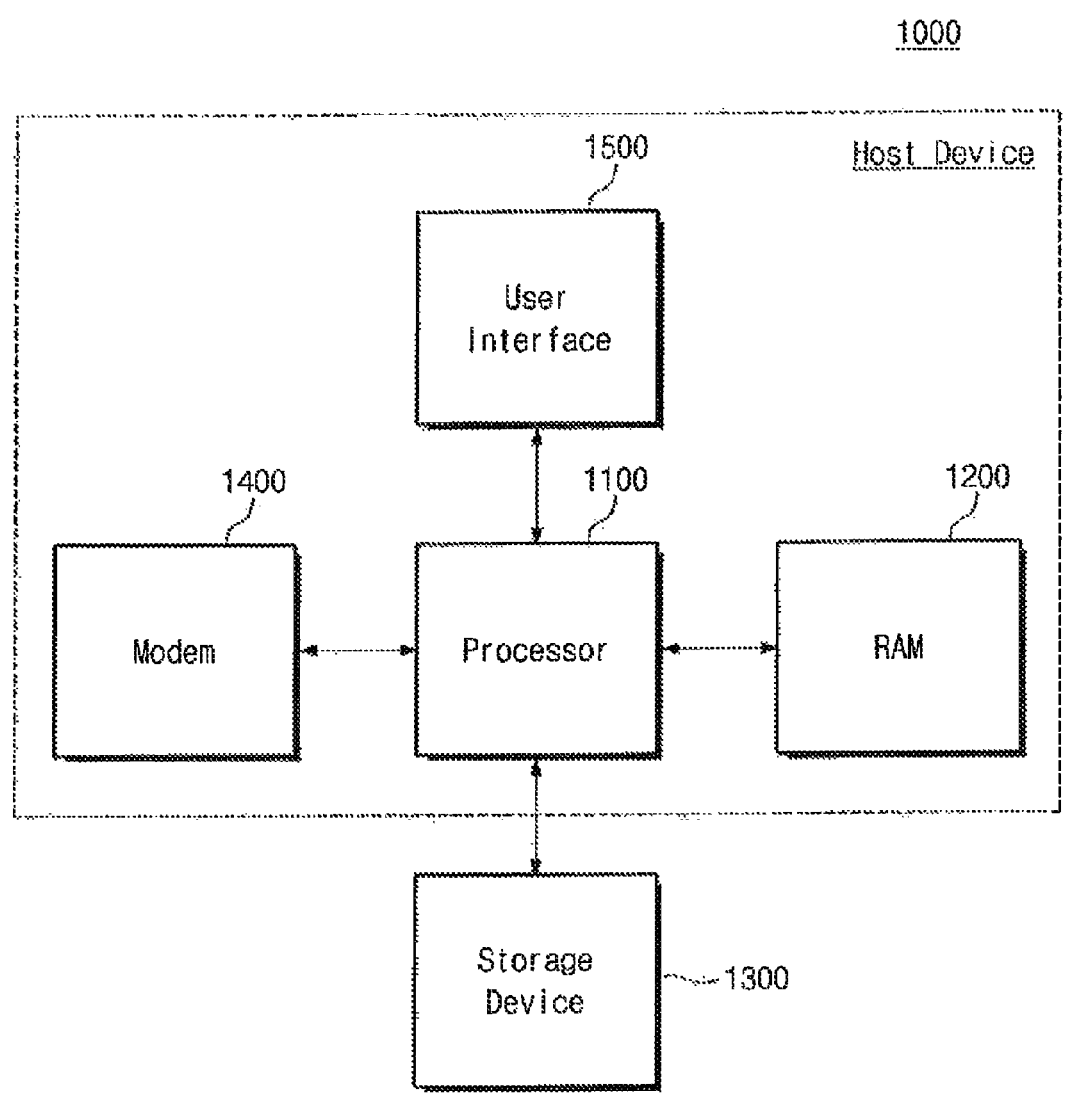
FIG. 23 is a block diagram illustrating a computing device in accordance with an exemplary embodiment of the inventive concept.

FIG. 23 is a block diagram illustrating a computing device 1000 in accordance with an exemplary embodiment of the inventive concept. Referring to FIG. 23, the computing device 1000 includes a processor 1100, a RAM 1200, a storage device 1300, a modem 1400 and a user interface 1500.

The processor 1100 can control an overall operation of the computing device 1000 and perform a logical operation. For example, the processor 1100 may be constituted in a system-on-chip (SoC). The processor 1100 may be a general-purpose processor, a specific-purpose processor, or an application processor.

The RAM 1200 can communicate with the processor 1100. The RAM 1200 may be a main memory of the processor 1100 or the computing device 1000. The processor 1100 can temporarily store a code or data in the RAM 1200. The processor 1100 can execute a code and process data using the RAM 1200. The processor 1100 can execute a variety of software such as an operating system, an application, etc. using the RAM 1200. The processor 1100 can control an overall operation of the computing device 1000 using the RAM 1200. The RAM 1200 may include a volatile memory such as an SRAM, a DRAM, an SDRAM, etc. or a nonvolatile memory such as a PRAM, an MRAM, an RRAM, an FeRAM, etc.

The storage device 1300 can communicate with the processor 1100. The storage device 1300 can store data to be preserved for a long time. In other words, the processor 1100 can store data to be preserved for a long time in the storage device 1300. The storage device 1300 can store a boot image for driving the computing device 1000. The storage device 1300 can store source codes of a variety of software such as an operating system, an application, etc. The storage device 1300 can store data processed by a variety of software such as an operating system, an application, etc.

The processor 1100 can drive a variety of software such as an operating system, an application, etc. by loading source codes stored in the storage device 1300 into the RAM 1200 and then executing the source codes loaded into the RAM 1200. The processor 1100 can load data stored in the storage device 1300 into the RAM 1200 and process the data loaded into the RAM 1200. The processor 1100 can load data to be preserved for a long time among data stored in the RAM 1200 in the storage device 1300.

The storage device 1300 may include a nonvolatile memory such as a flash memory, a PRAM, an MRAM, an RRAM, an FeRAM, etc.

The modem 1400 can communicate with an external device under the control of the processor 1100. For example, the modem 1400 can perform a wired or wireless communication with an external device. The modem 1400 can perform a communication based on at least one of various wireless communication methods such as a long term evolution (LTE), a worldwide interoperability for microwave access (WiMax), a global system for mobile communication (GSM), a code division multiple access (CDMA), a Bluetooth, a near field communication (NFC), a wireless fidelity (WiFi), a radio frequency Identification (RFID), or at least one of various wired communication methods such as a USB, a SATA, an SCSI, a Firewire, a PCI, a PCIe, an NVMe, a UFS, an SD, a secure digital input output (SDIO), a universal asynchronous receiver transmitter (UART), a serial peripheral interface (SPI), a high speed SPI (HS-SPI), an RS232, an inter-integrated circuit (I2C), a high speed (HS)-I2C, an integrated-interchip sound (I2S), a sony/philips digital interface (S/PDIF), an MMC, an eMMC, etc.

The user interface 1500 can communicate with a user under the control of the processor 1100. For example, the user interface 1500 may include user input interfaces such as a keyboard, a keypad, a button, a touch panel, a touch screen, a touch pad, a touch ball, a camera, a microphone, a gyroscope sensor, a vibration sensor, etc. The user interface 1500 may include user output interfaces such as a liquid crystal display (LCD), an organic light emitting diode (OLED) display, an active matrix OLED (AMOLED) display, a light emitting diode (LED), a speaker, a motor, etc.

The storage device 1300 may include the storage device 100 according to exemplary embodiments of the inventive concept. The processor 1100, the RAM 1200, the modem 1400 and the user interface 1500 can form a host device communicating with the storage device 1300.

According to exemplary embodiments of the inventive concept, threshold voltages of cell transistors, in particular, ground select transistors are programmed within the target range. Thus, a nonvolatile memory device having increased reliability and an operation method of the nonvolatile memory device are provided.

While the inventive concept has been described with reference to exemplary embodiments thereof, it will be apparent to those skilled in the art that various changes and modifications may be made thereto without departing from the scope of the inventive concept as defined by the following claims.

What is claimed is:

1. A method of operating a nonvolatile memory device including a plurality of strings, each string including a plurality of string selection transistors, a plurality of memory cell transistors, and a plurality of ground selection transistors sequentially stacked in a direction perpendicular to a surface of a substrate on which the cell string is disposed, the method comprising:
    performing a first program operation on a first memory cell transistor of the plurality of memory cells, the first memory cell transistor having a first threshold voltage after the first program operation;
    performing a verify operation on the first memory cell transistor using a verify voltage, the verify voltage being an upper limit of a target threshold voltage of the first memory cell transistor after the first program operation;
    determining whether the first threshold voltage is higher than the verify voltage; and
    upon determining that the first threshold voltage is higher than the verify voltage, performing a second program operation on the first memory cell transistor to decrease the threshold voltage of the first memory cell transistor from the first threshold voltage, the first memory cell transistor having a second threshold voltage after the second program operation,
    wherein the second threshold voltage is lower than the first threshold voltage.

2. The method of claim 1, wherein the first program operation is an operation for increasing a threshold voltage level of target memory cells from initial threshold voltage to the first threshold voltage, and includes applying a first program operation voltage to gate of the first memory cell transistor, the first program operation voltage being a positive voltage, and supplying a low voltage to a channel of the first memory cell transistor.

3. The method of claim 2, wherein the low voltage is provided by supplying a first low voltage to a drain of the first memory cell transistor through a bit line coupled to the first memory cell transistor and by supplying a second low voltage to source of the first memory cell transistor through a common source line (CSL) coupled to the first memory cell transistor.

4. The method of claim 3, wherein the first low voltage and the second low voltage are ground voltages respectively.

5. The method of claim 1, wherein the second program operation includes applying a second program operation voltage to a gate of the first memory cell transistor, the second program operation voltage being a negative voltage.

6. The method of claim 5, wherein the second program operation further includes supplying a third low voltage to a source of the first memory cell transistor through a common source line (CSL) coupled to the first memory cell transistor.

7. The method of claim 6, wherein the drain of the first memory cell transistor is electrically floated by supplying a first high voltage to a selected bit line and a second high voltage to a gate of a corresponding string selection transistor respectively.

8. The method of claim 7, wherein the second program operation further includes applying pass voltages on gates of transistors of a selected string except the gate of the first memory cell transistor.

9. The method of claim 1, wherein the method further includes:
    performing the first program operation on a second memory cell transistor of the plurality of memory cells to increase the threshold voltage of the second memory cell transistor, the second memory cell transistor having third threshold voltage after the first program operation;
    performing the verify operation on the second memory cell transistor using the verify voltage;
    determining whether the third threshold voltage is equal to or lower than the verify voltage; and
    upon determining that the third threshold voltage is equal to or lower than the verify voltage, inhibiting the second program operation on the second memory cell transistor while performing the second program operation on the first memory cell transistor.

10. A method of operating a nonvolatile memory device including a plurality of strings, each string including a plurality of string selection transistors, a plurality of memory cell transistors, and a plurality of ground selection transistors sequentially stacked in a direction perpendicular to a surface of a substrate on which the cell string is disposed, the method comprising:
    performing a first program operation on a first ground selection transistor, the first ground selection transistor having a first threshold voltage after the first program operation;
    performing a verify operation on the first ground selection transistor using a verify voltage, the verify voltage being an upper limit of a target threshold voltage of the first ground selection transistor after the first program operation;
    determining whether the first threshold voltage is higher than the verify voltage; and
    upon determining that the first threshold voltage is higher than the verify voltage, performing a second program operation on the first ground selection transistor to decrease the threshold voltage of the first ground selection transistor from the first threshold voltage, the first ground selection transistor having a second threshold voltage after the second program operation,
    wherein the second threshold voltage is lower than the first threshold voltage.

11. The method of claim 10, wherein the first program operation is an operation for increasing a threshold voltage level of target memory cells from an initial threshold voltage to the first threshold voltage, and includes applying a first program operation voltage to a gate of the first ground selection transistor, the first program operation voltage being a positive voltage, and supplying a low voltage to a channel of the first ground selection transistor.

12. The method of claim 11, wherein the low voltage is provided by supplying a first low voltage to a drain of the first ground selection transistor through a bit line coupled to the first ground selection transistor and by supplying a second low voltage to a source of the first ground selection transistor through a common source line (CSL) coupled to the first ground selection transistor.

13. The method of claim 12, wherein the first low voltage and the second low voltage are ground voltages respectively.

14. The method of claim 10, wherein the second program operation includes applying a second program operation voltage to the gate of the first ground selection transistor, the second program operation voltage being a negative voltage.

15. The method of claim 14, wherein the second program operation further includes supplying a third low voltage to a source of the first ground selection transistor through a common source line (CSL) coupled to the first ground selection transistor.

16. The method of claim 15, wherein the drain of the first ground selection transistor is electrically floated by supplying a first high voltage to a selected bit line and applying a second high voltage to a gate of a corresponding string selection transistor respectively.

17. The method of claim 16, wherein the second program operation further includes applying pass voltages on gates of transistors of a selected string except a gate of the first ground selection transistor.

18. The method of claim 10, wherein the method further includes:
 performing the first program operation on a second ground selection transistor of the plurality of memory cells to increase the threshold voltage of the second ground selection transistor, the second ground selection transistor having a third threshold voltage after the first program operation;
 performing the verify operation on the second ground selection transistor using the verify voltage;
 determining whether the third threshold voltage is equal to or lower than the verify voltage;
 upon determining that the third threshold voltage is equal to or lower than the verify voltage, inhibiting the second program operation on the second ground selection transistor while performing the second program operation on the first ground selection transistor.

19. A method of operating a nonvolatile memory device including a plurality of strings, each string including a plurality of string selection transistors, a plurality of memory cell transistors, and a first ground selection transistor and a second ground selection transistor sequentially stacked in a direction perpendicular to a surface of a substrate on which the cell string is disposed, the method comprising:
 applying a first program operation voltage to a gate of the first ground selection transistor, the first program operation voltage being a positive voltage, and supplying a low voltage to a channel of the first ground selection transistor;
 performing a verify operation on the first ground selection transistor using a verify voltage, the verify voltage being an upper limit of a target threshold voltage of the first ground selection transistor after the first program operation;
 determining whether the threshold voltage of the first ground selection transistor is higher than the verify voltage; and
 upon determining that the first threshold voltage is higher than the verify voltage, applying a second program operation voltage to the gate of the first ground selection transistor, the second program operation voltage being a negative voltage, and electrically floating a drain of the first ground selection transistor and supplying a third low voltage to a source of the first ground selection transistor through a common source line (CSL) coupled to the first ground selection transistor.

20. The method of claim 19, wherein the method further provides a pass voltage to a gate of the second ground selection transistor, thereby boosting a channel voltage of the second ground selection transistor to a boost voltage.

21. A nonvolatile memory device comprising:
 a memory cell array including a plurality of strings, each string including a plurality of string selection transistors, a plurality of memory cell transistors, and a plurality of ground selection transistors sequentially stacked in a direction perpendicular to a surface of a substrate on which the cell string is disposed; and
 a control logic circuit configured to:
 perform a first program operation on a first ground selection transistor, the first ground selection transistor having a first threshold voltage after the first program operation;
 perform a verify operation on the first ground selection transistor using a verify voltage, the verify voltage being an upper limit of a target threshold voltage of the first ground selection transistor after the first program operation;
 determine whether the first threshold voltage is higher than the verify voltage; and
 upon determining that the first threshold voltage is higher than the verify voltage, perform a second program operation on the first ground selection transistor to decrease the threshold voltage of the first ground selection transistor from the first threshold voltage, the first ground selection transistor having second threshold voltage after the second program operation, wherein the second threshold voltage is lower than the first threshold voltage.

22. The device of claim 21, wherein the control logic circuit includes a program control circuit, the program control circuit controlling the first and second program operations by providing bias voltages on the gate and the substrate of the first ground selection transistor.

23. The device of claim 22, wherein the program control circuit is configured to apply a first program operation voltage to gate of the first ground selection transistor, the first program operation voltage being a positive voltage, and to supply a low voltage to a channel of the first ground selection transistor.

24. The device of claim 23, wherein the low voltage is provided by supplying a first low voltage to a drain of the first ground selection transistor through a bit line coupled to the first ground selection transistor and by supplying a second low voltage to a source of the first ground selection transistor through a common source line (CSL) coupled to the first ground selection transistor.

25. The method of claim 22, wherein the program control circuit is further configured to apply a second program operation voltage to the gate of the first ground selection transistor, the second program operation voltage being a negative voltage during the second program operation.

26. The method of claim 25, wherein the program control circuit is further configured to supply a third low voltage to a source of the first ground selection transistor through a common source line (CSL) coupled to the first ground selection transistor during the second program operation.

* * * * *